United States Patent
Kim et al.

(10) Patent No.: US 8,283,248 B2
(45) Date of Patent: Oct. 9, 2012

(54) METHODS OF MANUFACTURING SEMICONDUCTOR DEVICES

(75) Inventors: Tae-Hyun Kim, Suwon-si (KR); Kyung-Hyun Kim, Seoul (KR); Jae-Hwang Sim, Seoul (KR); Jae-Jin Shin, Seoul (KR); Jong-Heun Lim, Seoul (KR); Hyun-Min Park, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/234,558

(22) Filed: Sep. 16, 2011

(65) Prior Publication Data
US 2012/0070976 A1 Mar. 22, 2012

(30) Foreign Application Priority Data
Sep. 17, 2010 (KR) ................ 10-2010-0091504

(51) Int. Cl.
*H01L 21/4763* (2006.01)
(52) U.S. Cl. ........ 438/619; 438/201; 438/211; 438/592; 438/593; 257/E21.199
(58) Field of Classification Search .............. 438/201, 438/211, 257, 264, 592–954; 257/E21.199, 257/E21.422
See application file for complete search history.

(56) References Cited

U.S. PATENT DOCUMENTS
7,800,155 B2 * 9/2010 Matsuno .............. 257/315

FOREIGN PATENT DOCUMENTS
JP 2008-078298 4/2008
JP 2009-212218 9/2009
KR 10-2008-0022380 A 3/2008
* cited by examiner

*Primary Examiner* — Thanhha Pham
(74) *Attorney, Agent, or Firm* — Lee & Morse, P.C.

(57) ABSTRACT

A method of manufacturing a semiconductor device includes forming a plurality of preliminary gate structures, forming a capping layer pattern on sidewalls of the plurality of preliminary gate structures, and forming a blocking layer on top surfaces of the plurality of preliminary gate structures and the capping layer pattern such that a void is formed therebetween. The method also includes removing the blocking layer and an upper portion of the capping layer pattern such that at least the upper sidewalls of the plurality of preliminary gate structures are exposed, and a lower portion of the capping layer pattern remains on lower sidewalls of the preliminary gate structures. The method further includes forming a conductive layer on at least the upper sidewalls of the plurality of preliminary gate structures, reacting the conductive layer with the preliminary gate structures, and forming an insulation layer having an air gap therein.

20 Claims, 15 Drawing Sheets

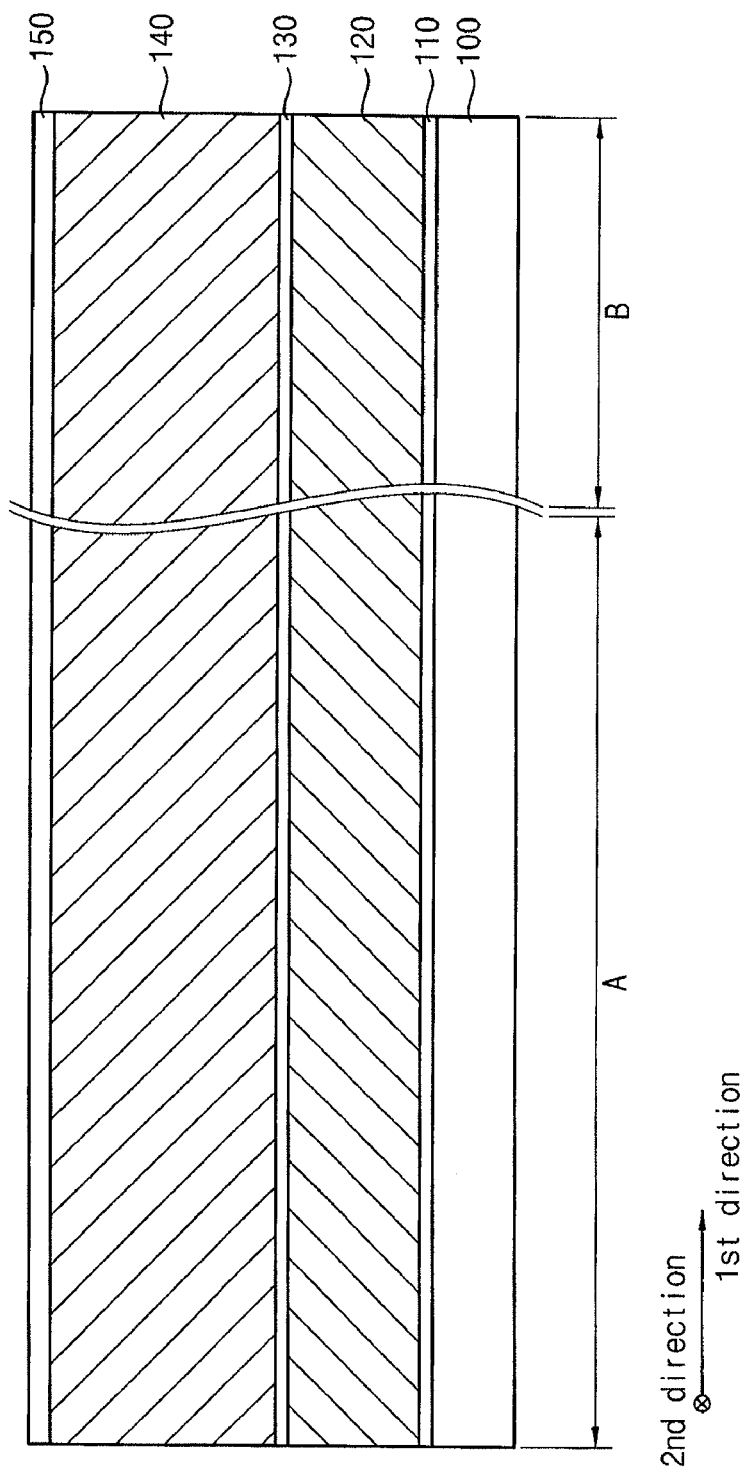

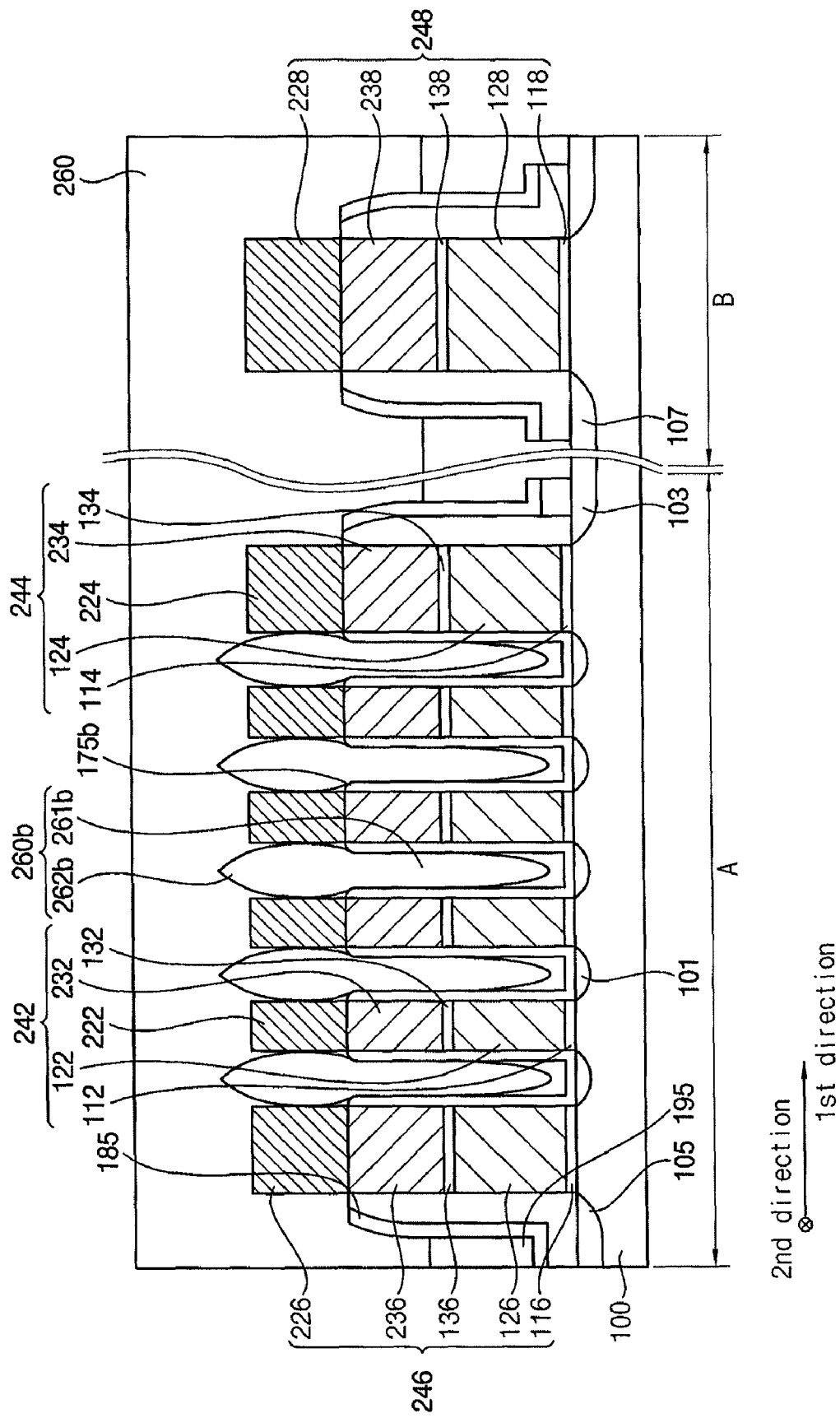

METHODS OF MANUFACTURING SEMICONDUCTOR DEVICES

CROSS-REFERENCE TO RELATED APPLICATION

Korean Patent Application No. 10-2010-0091504, filed on Sep. 17, 2010, in the Korean Intellectual Property Office, and entitled: "Methods of Manufacturing Semiconductor Devices," is incorporated by reference herein in its entirety.

BACKGROUND

As semiconductor devices have been highly integrated, a threshold voltage may be changed due to the parasitic capacitance between word lines.

SUMMARY

Embodiments may be realized by providing a method of manufacturing a semiconductor device that includes forming a plurality of preliminary gate structures on a substrate, forming a capping layer pattern on sidewalls of the plurality of preliminary gate structures and on a top surface of the substrate between the preliminary gate structures, forming a blocking layer on top surfaces of the plurality of preliminary gate structures and the capping layer pattern such that a void is formed between the blocking layer and the capping layer pattern, removing the blocking layer and an upper portion of the capping layer pattern such that at least the upper sidewalls of the plurality of preliminary gate structures are exposed, a lower portion of the capping layer pattern remaining on lower sidewalls of the preliminary gate structures, forming a conductive layer on at least the upper sidewalls of the plurality of preliminary gate structures, reacting the conductive layer with the preliminary gate structures to form a plurality of gate structures, and forming a second insulation layer on the substrate to cover the gate structures, the second insulation layer having an air gap therein between the plurality of gate structures.

The method may include forming a first insulation layer. Forming the capping layer pattern may include forming a capping layer on the substrate, the capping layer covering the preliminary gate structures, and the capping layer having a gap therein between the preliminary gate structures. The first insulation layer may be formed on the capping layer and the substrate. Forming the capping layer pattern may include planarizing upper portions of the first insulation layer and the capping layer until the top surfaces of the preliminary gate structures and the gap are exposed.

The method may include forming an etch stop layer on the capping layer and the substrate after forming the capping layer. The first insulation layer may be formed on the etch stop layer. Planarizing the upper portions of the first insulation layer and the capping layer may include planarizing an upper portion of the etch stop layer.

Forming the capping layer pattern may include performing a dry etching process using a gas including fluorine. The gas including fluorine may be a gas mixture including nitrogen trifluoride ($NF_3$) and ammonia ($NH_3$). The capping layer pattern may be formed using at least one of silicon oxide, silicon nitride, and silicon oxynitride. The method may include forming a first capping thin film pattern by a cleaning process on the capping layer pattern, and a thickness of the first capping thin film pattern may be smaller than a thickness of the capping layer pattern.

The blocking layer may be formed using at least one of a borophospho silicate glass (BPSG), a phospho silicate glass (PSG,) an undoped silicate glass (USG), a spin on glass (SOG), a flowable oxide (FOX), tetraethyl orthosilicate (TEOS), a plasma enhanced tetraethyl orthosilicate (PE-TEOS), and a high density plasma chemical vapor deposition (HDP-CVD) oxide. The blocking layer may be formed by a plasma enhanced chemical vapor deposition (PECVD) process using tetraethyl orthosilicate (TEOS) and an ozone plasma. A thickness of the blocking layer may be about 100 Å to about 500 Å.

Each preliminary gate structure of the plurality of preliminary gate structures may include a tunnel insulation layer pattern, a floating gate, a dielectric layer pattern, and a preliminary control gate sequentially stacked on the substrate. The capping layer pattern may cover the top surface of the substrate between the preliminary gate structures an at least sidewalls of the tunnel insulation layer pattern, the floating gate, and the dielectric layer pattern. Each of the preliminary gate structures may include doped polysilicon. The conductive layer may include cobalt or nickel. Reacting the conductive layer with the preliminary gate structures may include performing a silicidation process.

The method may include performing a stripping process to remove a portion of the conductive layer that is substantially unreacted with the preliminary gate structures. The method may include, after performing the stripping process, removing a surface of the capping layer pattern to form a second capping thin film pattern. The method may include forming a sacrificial layer covering the capping layer pattern and the plurality of gate structures. The forming the second capping thin film pattern may include partially removing the sacrificial layer and the capping layer pattern.

Embodiments may also be realized by providing a method of manufacturing a semiconductor device that includes forming a plurality of preliminary gate structures on a substrate, forming a capping layer pattern on sidewalls of the plurality of preliminary gate structures, forming a blocking layer on the capping layer such that a void is formed between the blocking layer and the capping layer pattern, exposing top surfaces and upper sidewalls of the plurality of preliminary gate structures by removing the blocking layer and an upper portion of the capping layer pattern, a lower portion of the capping layer pattern remaining on lower sidewalls of the preliminary gate structures, forming a conductive layer on the top surfaces and the upper sidewalls of the plurality of preliminary gate structures, reacting the conductive layer with the top surfaces and the upper sidewalls of the preliminary gate structures to form a plurality of gate structures, and covering the plurality of gate structures with an insulation layer, the insulation layer having an air gap therein between the gate structures.

Reacting the conductive layer with the top surfaces and the upper sidewalls of the plurality of preliminary gate structures may include forming a metal silicide layer by performing a silicidation process, and the metal silicide layer may form an upper portion of the plurality of gate structures. Exposing the top surfaces and the upper sidewalls of the plurality of preliminary gate structures may include exposing the void formed between the blocking layer and the capping layer pattern prior to forming the conductive layer. The conductive layer may be formed such that the conductive layer overhangs the void.

The lower portion of the capping layer pattern may remain on the lower sidewalls of the preliminary gate structures during the reacting of the conductive layer with the top surfaces and the upper sidewalls of the preliminary gate structures. The air gap may be formed after reacting the conductive layer with the top surfaces and the upper sidewalls of the preliminary gate structures. A boundary of the air gap may be defined by the insulation layer. When the air gap is formed, the lower portion of the capping layer pattern may remain on the lower sidewalls of the preliminary gate structures such that the air gap is adjacent to the lower portion of the capping layer pattern and adjacent to the metal silicide layer.

Embodiments may also be realized by providing a capping layer covering a plurality of preliminary gate structures and having a seam between the preliminary gate structures may be formed on a substrate, and planarized until top surfaces of the preliminary gate structures are exposed to form a capping layer pattern. A blocking layer may be formed on the exposed top surfaces of the preliminary gate structures and a top surface of the capping layer pattern, and the blocking layer and a portion of the capping layer pattern may be removed to expose upper portions of the preliminary gate structures. A silicidation process may be performed on the upper portions of the preliminary gate structures to form gate structures including control gates having a low resistance. A deposition process having poor step coverage may be performed to form an insulation layer having an air gap between the gate structures, thereby decreasing the parasitic capacitance of a semiconductor device. The air gap may be formed to have a top surface higher than those of the gate structures and may be uniformly formed.

BRIEF DESCRIPTION OF THE DRAWINGS

Features will become apparent to those of ordinary skill in the art by describing in detail exemplary embodiments with reference to the attached drawings, in which:

FIGS. 1 to 13 illustrate cross-sectional views of stages in a method of manufacturing a semiconductor device in accordance with exemplary embodiments.

DETAILED DESCRIPTION

Figure 2A:
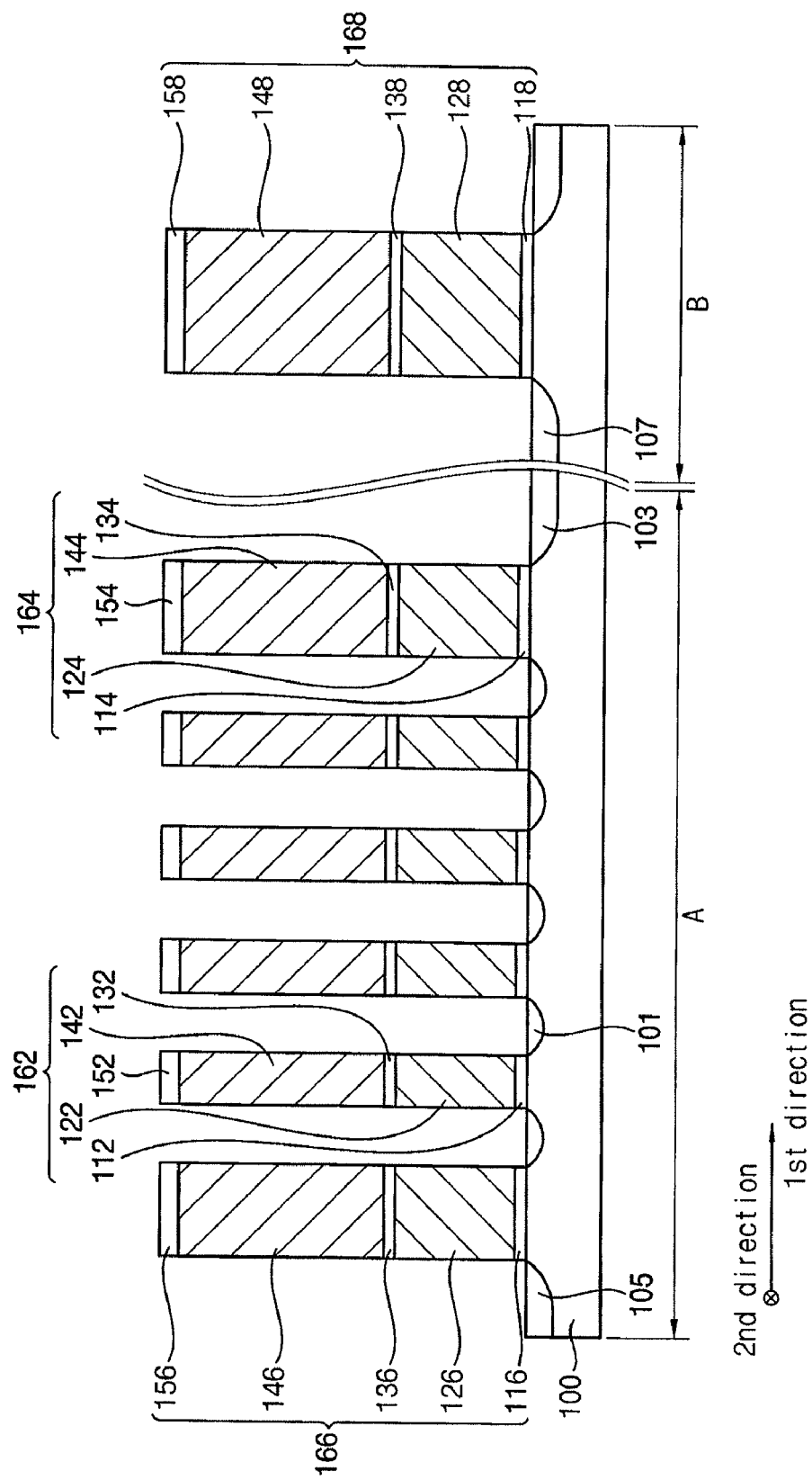

Various example embodiments will be described more fully hereinafter with reference to the accompanying drawings, in which some example embodiments are shown. Embodiments, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers. Like numerals refer to like elements throughout. As used herein, the term "and/or" includes any and all combinations of one or more of the associated listed items.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of exemplary embodiments (and intermediate structures). As such, variations from the shapes of the illustrations as a result, e.g., of manufacturing techniques and/or tolerances, may be expected. Thus, example embodiments should not be construed as limited to the particular shapes of regions illustrated herein but are to include deviations in shapes and/or configurations that result, e.g., from manufacturing. Thus, the regions illustrated in the figures are schematic in nature and their shapes are not intended to illustrate the actual shape of a region of a device and are not intended to limit the scope of the embodiments.

Hereinafter, example embodiments will be explained in detail with reference to the accompanying drawings.

FIGS. 1 to 13 illustrate cross-sectional views of stages in a method of manufacturing a semiconductor device in accordance with exemplary embodiments.

Referring to FIG. 1, a tunnel insulation layer 110, a floating gate layer 120, a dielectric layer 130, a control gate layer 140, and a hard mask layer 150 may be sequentially formed on a substrate 100.

The substrate 100 may be a semiconductor substrate, e.g., a silicon substrate, a germanium substrate or a silicon-germanium substrate, a silicon-on-insulator (SOI) substrate, a germanium-on-insulator (GOI) substrate, etc. The substrate 100 may include a well region (not shown) doped with p-type and/or n-type impurities.

The substrate 100 may include an active region and a field region, e.g., formed by a plurality of isolation layers (not shown). The isolation layers may extend in a first direction, e.g., each isolation layer may be elongated in the first direction. The isolation layers may be arranged in a second direction, e.g., the plurality of isolation layers may be arranged substantially parallel to each other along the second direction. The second direction may be substantially perpendicular to the first direction. According to an exemplary embodiment, a region in which the isolation layers are formed may be referred to as the field region. A region in which the isolation layers are excluded, e.g., are not formed, may be referred to as the active region. FIGS. 1 to 13 illustrate cross-sectional views of the active regions of the semiconductor devices according to exemplary embodiments.

The substrate 100 may include a first region A and a second region B. In example embodiments, the first region A may serve as a cell region for, e.g., forming memory cells. The first region A may include at least one active region on the substrate 100. The second region B may serve as a peripheral region or core region for, e.g., forming peripheral circuits.

The tunnel insulation layer 110 may be formed using insulating material. For example, the tunnel insulation layer 110 may be made of and/or may include at least one of an oxide such as silicon oxide, a nitride such as silicon nitride, a silicon oxide doped with impurities, or a low-k dielectric material.

The floating gate layer 120 may be formed using, e.g., doped polysilicon and/or a metal having a high work function such as tungsten, titanium, cobalt, nickel, etc.

The dielectric layer 130 may be formed using at least one of an oxide and a nitride. For example, the dielectric layer 130 may have a multi-layered structure of oxide/nitride/oxide (ONO). Alternatively, the dielectric layer 130 may be formed using a metal oxide having a high dielectric constant, e.g., so that the semiconductor device may have a high capacitance and improved leakage current characteristics. The high-k metal oxide may include, e.g., at least one of hafnium oxide, titanium oxide, tantalum oxide, zirconium oxide, aluminum oxide, etc.

The control gate layer 140 may be formed using, e.g., at least one of doped polysilicon, a metal, a metal nitride, a metal silicide, etc. In example embodiments, the control gate layer 140 may be formed to include doped polysilicon at least at an upper portion of the control gate layer 140.

The hard mask layer 150 may be formed using, e.g., at least one of silicon oxide, silicon nitride, and silicon oxynitride.

According to another exemplary embodiment, a charge trapping layer 120, a blocking layer 130, and a gate electrode layer 140 may be sequentially formed on the tunnel insulation layer 110 instead of the floating gate layer 120, the dielectric layer 130, and the control gate layer 140, respectively.

The charge trapping layer 120 may be formed using, e.g., a nitride such as silicon nitride and/or a metal oxide such as hafnium oxide. The blocking layer 130 may be formed using, e.g., silicon oxide and/or a high-k metal oxide such as hafnium oxide, titanium oxide, tantalum oxide, zirconium oxide, aluminum oxide, etc. The gate electrode layer 140 may be formed using, e.g., at least one of doped polysilicon, a metal, a metal nitride, a metal silicide, etc. In example embodiments, the gate electrode layer 140 may be formed to include doped polysilicon at an upper portion thereof, e.g., the uppermost portion of the gate electrode layer 140 may be formed of a layer of doped polysilicon. The uppermost portion of the gate electrode layer 140 may be the portion of the gate electrode layer 140 that is disposed at a furthest distance away from the substrate 100.

Hereinafter, only the exemplary embodiment of a structure including the floating gate layer 120, the dielectric layer 130, and the control gate layer 140 sequentially stacked on the tunnel insulation layer 110 is illustrated for ease of explanation. However, embodiments are not limited thereto.

Referring to FIG. 2A, the hard mask layer 150, the control gate layer 140, the dielectric layer 130, the floating gate layer 120, and the tunnel insulation layer 110 may be sequentially etched by, e.g., a photolithography process, to form an etched pattern on the substrate 100. The etched pattern on the substrate 100 may include at least one of a first preliminary gate structure 162, a second preliminary gate structure 164, a third preliminary gate structure 166, and a fourth preliminary gate structure 168 on the substrate 100.

The first, the second, and the third preliminary gate structures 162, 164, and 166 may be formed in the first region A. According to an exemplary embodiment, a plurality of the first preliminary gate structures 162 may be arranged between the second and the third preliminary gate structures 164 and 166. For example, 16 or 32 first preliminary gate structures 162 may be formed between one second preliminary gate structure 164 and one third preliminary gate structure 166. The fourth preliminary gate structure 168 may be formed in the second region B. According to an exemplary embodiment, the first, the second, and the third preliminary gate structures 162, 164, and 166 may be excluded, e.g., not formed, in the second region B. The fourth preliminary gate 168 may be excluded, e.g., not formed, in the first region A.

The first through fourth preliminary gate structures 162, 164, 166, and 168 may include first through fourth tunnel insulation layer patterns 112, 114, 116, and 118, first through fourth floating gates 122, 124, 126, and 128, first through fourth dielectric layer patterns 132, 134, 136, and 138, first through fourth preliminary control gates 142, 144, 146, and 148, and first through fourth hard masks 152, 154, 156, and 158, respectively, stacked, e.g., sequentially stacked, on the substrate 100. For example, the first preliminary gate structure 162 may have a stacked structure including the first insulation layer pattern 112 on, e.g., directly on, the substrate 100, the first floating gate 122 on, e.g., directly on, the first insulation layer pattern 112, the first dielectric layer pattern 132 on, e.g., directly on, the first floating gate 122, the first preliminary control gate 142 on, e.g., directly on, the first dielectric layer pattern, and the first hard mask on, e.g., directly on, the first preliminary control gate 142. The second through fourth preliminary gate structures 164, 166, and 168 may have structures substantially similar to the structure of the first preliminary gate structure 162.

In example embodiments, the tunnel insulation layer patterns 112, 114, 116, and 118 may be formed to have, e.g., an island shape, and to be spaced apart from each other on the substrate 100 in the active region. The floating gates 122, 124, 126, and 128 may be formed to have, e.g., an island shape, and to be spaced apart from each other on the tunnel insulation layer patterns 112, 114, 116, and 118, respectively, in the active region. In an exemplary embodiment, each of the dielectric layer patterns 132, 134, 136, and 138, and each of the preliminary control gates 142, 144, 146, and 148 may be formed to extend in the second direction and may be sequentially formed on the floating gates 122, 124, 126, and 128, respectively, and the isolation layer 106.

Figure 2B:
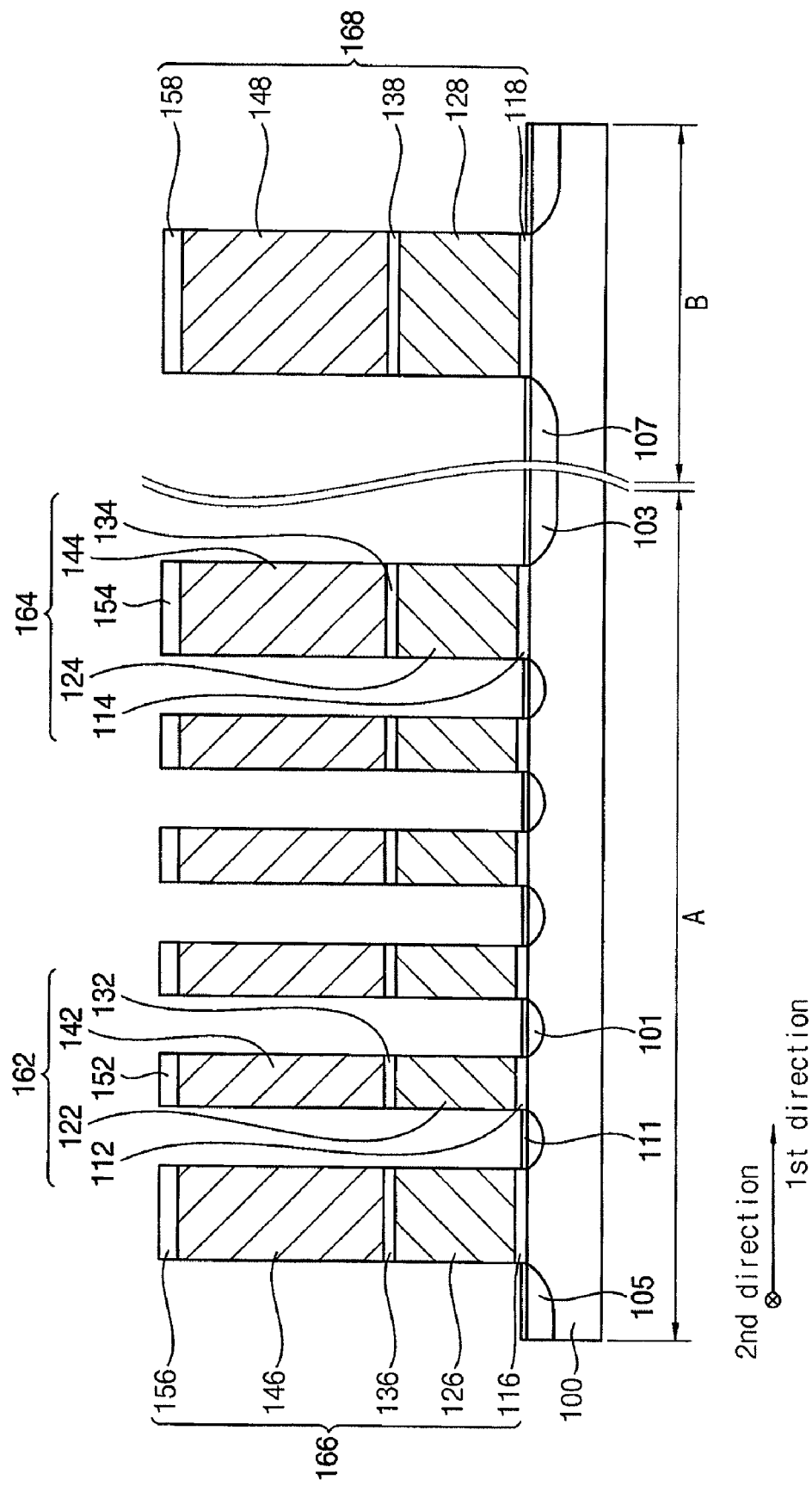

According to another exemplary embodiment, referring to FIG. 2B, the tunnel insulation layer patterns 112, 114, 116, and 118 may not have the island shape, e.g., may extend in the first direction. The first direction may intersect the second direction in which the dielectric layer patterns 132, 134, 136, and 138 may extend, and each of the preliminary control gates 142, 144, 146, and 148 may extend. In this case, portions of the tunnel insulation layer patterns 112, 114, 116, and 118 that are not covered by the floating gates 122, 124, 126, and 128, respectively, may have a relatively small thickness, e.g., may have a smaller thickness than the portions that are covered by the floating gates 122, 124, 126, and 128.

The portions of the tunnel insulation layer patterns 112, 114, 116, and 118 that are not covered by the floating gates 122, 124, 126, and 128, respectively, may be referred to as a fifth tunnel insulation layer pattern 111. The fifth tunnel insulation layer pattern 111 may be formed by patterning the tunnel insulation layer 110 to form a plurality of lines or bars extending in the first direction in the active region and removing upper portions of the lines or bars not covered by the floating gates 122, 124, 126, and 128. The fifth tunnel insulation layer pattern 111 may be formed between adjacent preliminary gate structures, e.g., ones of the first, the second, the third, and the fourth preliminary gate structures 162, 164, 166, and 168. The tunnel insulation layer 110 may not be completely removed from the substrate 100, e.g., the tunnel insulation layer may remain on portions of the top surface of the substrate 100 that do not have the preliminary gate structures formed thereon. Thus, damage to the substrate 100, e.g., during the patterning process, may be minimized and/or prevented.

First impurities may be implanted into the substrate 100 using, e.g., the preliminary gate structures 162, 164, 166, and 168 as an ion implantation mask, e.g., as illustrated in FIG. 2A. Thus, first, second, third, and fourth impurity regions 101, 103, 105, and 107 may be formed at upper portions of the substrate 100, e.g., adjacent to at least one of the preliminary gate structures 162, 164, 166, and 168, respectively. The first impurity region 101 may be formed at upper portions of the substrate 100 adjacent to at least one of the first preliminary gate structures 162. The second impurity region 103 may be formed at an upper portion of the substrate 100 outside the second preliminary gate structure 164, e.g., adjacent to at least the second preliminary gate structure 164. The third impurity region 105 may be formed at an upper portion of the substrate 100 outside the third preliminary gate structure 166, e.g., adjacent to at least the third impurity region 105. The fourth impurity region 107 may be formed at an upper portion of the substrate 100 adjacent to the fourth preliminary gate structure 168. The fourth impurity region 107 may be formed in the second region B and may be excluded, e.g., not formed, in the first region A. The first, the second, and the third impurity regions 101, 103, and 105 may be formed in the first region A and may be excluded, e.g., not formed in the second region B.

Referring to FIG. 2B, according to another exemplary embodiment, the tunnel insulation layer patterns 112, 114, 116, and 118 may not have the island shape, e.g., may extend in the first direction. The first direction may intersect the second direction in which the dielectric layer patterns 132, 134, 136, and 138 may extend, and each of the preliminary control gates 142, 144, 146, and 148 may extend. In this case, portions of the tunnel insulation layer patterns 112, 114, 116, and 118 that are not covered by the floating gates 122, 124, 126, and 128, respectively, may have a relatively small thickness, e.g., may have a smaller thickness than the portions that are covered by the floating gates 122, 124, 126, and 128.

The portions of the tunnel insulation layer patterns 112, 114, 116, and 118 that are not covered by the floating gates 122, 124, 126, and 128, respectively, may be referred to as a fifth tunnel insulation layer pattern 111. The fifth tunnel insulation layer pattern 111 may be formed by patterning the tunnel insulation layer 110 to form a plurality of lines or bars extending in the first direction in the active region and removing upper portions of the lines or bars not covered by the floating gates 122, 124, 126, and 128. The fifth tunnel insulation layer pattern 111 may cover the first, the second, the third, and the fourth impurity regions 101, 103, 105, and 107. The fifth tunnel insulation layer pattern 111 may be formed between adjacent preliminary gate structures, e.g., ones of the first, the second, the third, and the fourth preliminary gate structures 162, 164, 166, and 168. The tunnel insulation layer 110 may not be completely removed from the substrate 100, e.g., the tunnel insulation layer may remain on portions of the top surface of the substrate 100 that do not have the preliminary gate structures formed thereon. Thus, damage to the substrate 100, e.g., during the patterning process, may be minimized and/or prevented.

Figure 3:
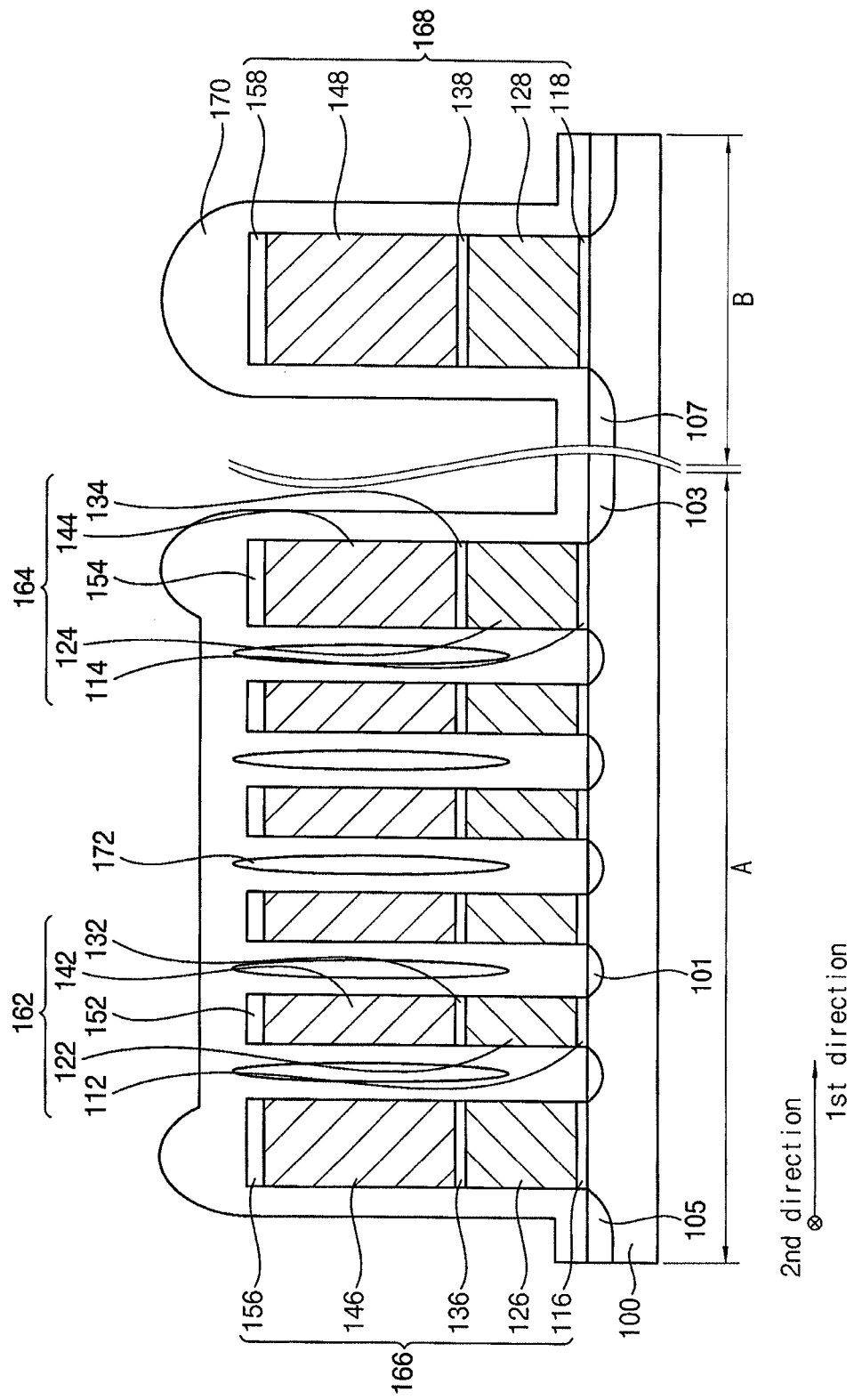

Referring to FIG. 3, a capping layer 170 may be formed on the substrate 100 to cover the preliminary gate structures 162, 164, 166, and 168 to fill spaces between the first to third preliminary gate structures 162, 164, and 166. The capping layer 170 may not completely fill the spaces between the first to third preliminary gate structures 162, 164 and 166, and first seams 172 may be formed therebetween. In an exemplary embodiment, each first seam 172 may extend in the second direction, e.g., the first seam 172 may be elongated in the second direction and may be disposed between adjacent preliminary gate structures 162, 164, and 166. The first seam 172 may be a gap, e.g., a void that excludes the capping layer 170, that extends in the second direction.

The capping layer 170 may be formed using, e.g., at least one of silicon oxide, silicon nitride, and silicon oxynitride. The capping layer 170 may be formed by, e.g., a chemical vapor deposition (CVD) process, an atomic layer deposition (ALD) process, a physical vapor deposition (PVD) process, etc. In an exemplary embodiment, the capping layer 170 may be formed using a high temperature oxide (HTO) or a middle temperature oxide (MTO) to have a thickness of, e.g., about 300 Å to about 600 Å. The first seams 172 may be formed by creating voids in regions between the first to third preliminary gate structures 162, 164 and 166, during the process of forming the capping layer 170.

Figure 4:
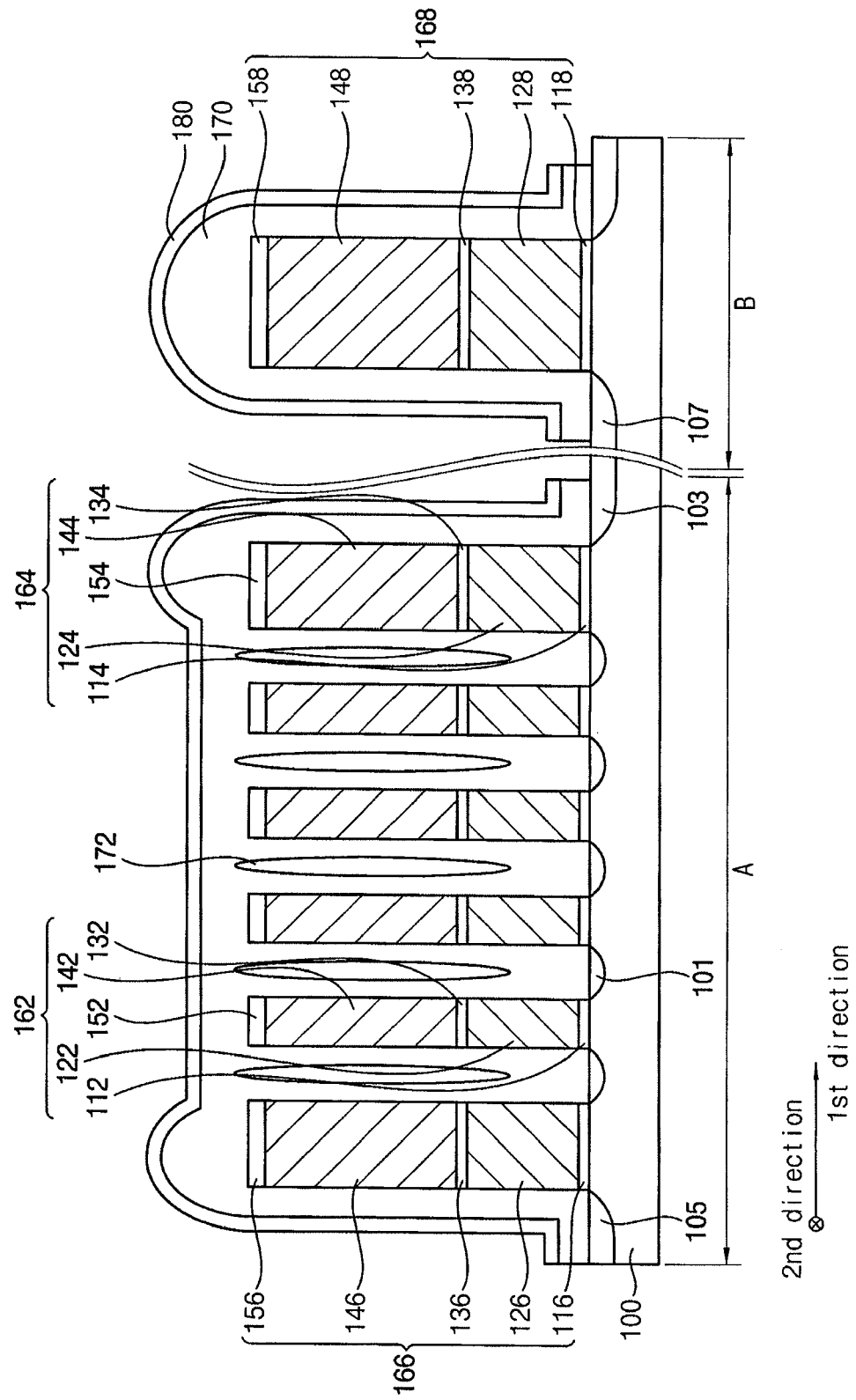

Referring to FIG. 4, an etch stop layer 180 may be formed on the capping layer 170 and the substrate 100. The etch stop layer 180 may be formed by, e.g., a CVD process, an ALD process, etc. In example embodiments, the etch stop layer 180 may be formed using, e.g., silicon nitride. The etch stop layer 180 may cover an upper surface of the capping layer 170. The etch stop layer 180 may be separated from the first seams 172 by the capping layer 170.

A photoresist pattern (not shown) may be formed, e.g., after forming the etch stop layer 180. The photoresist pattern may cover at least the gate structures 162, 164, 166, and 168. The photoresist pattern may be formed on the etch stop layer 180.

An etching process using the photoresist pattern as an etching mask may be performed to, e.g., partially remove the etch stop layer 180 and the capping layer 170. For example, the etching process may be performed so that top surfaces of the substrate 100 outside of the second and third preliminary gate structures 164 and 166 and adjacent to the fourth preliminary gate structure 168 may be exposed. Accordingly, portions of the substrate in both the first region A and the second region B may be exposed by the etching process.

Figure 5:
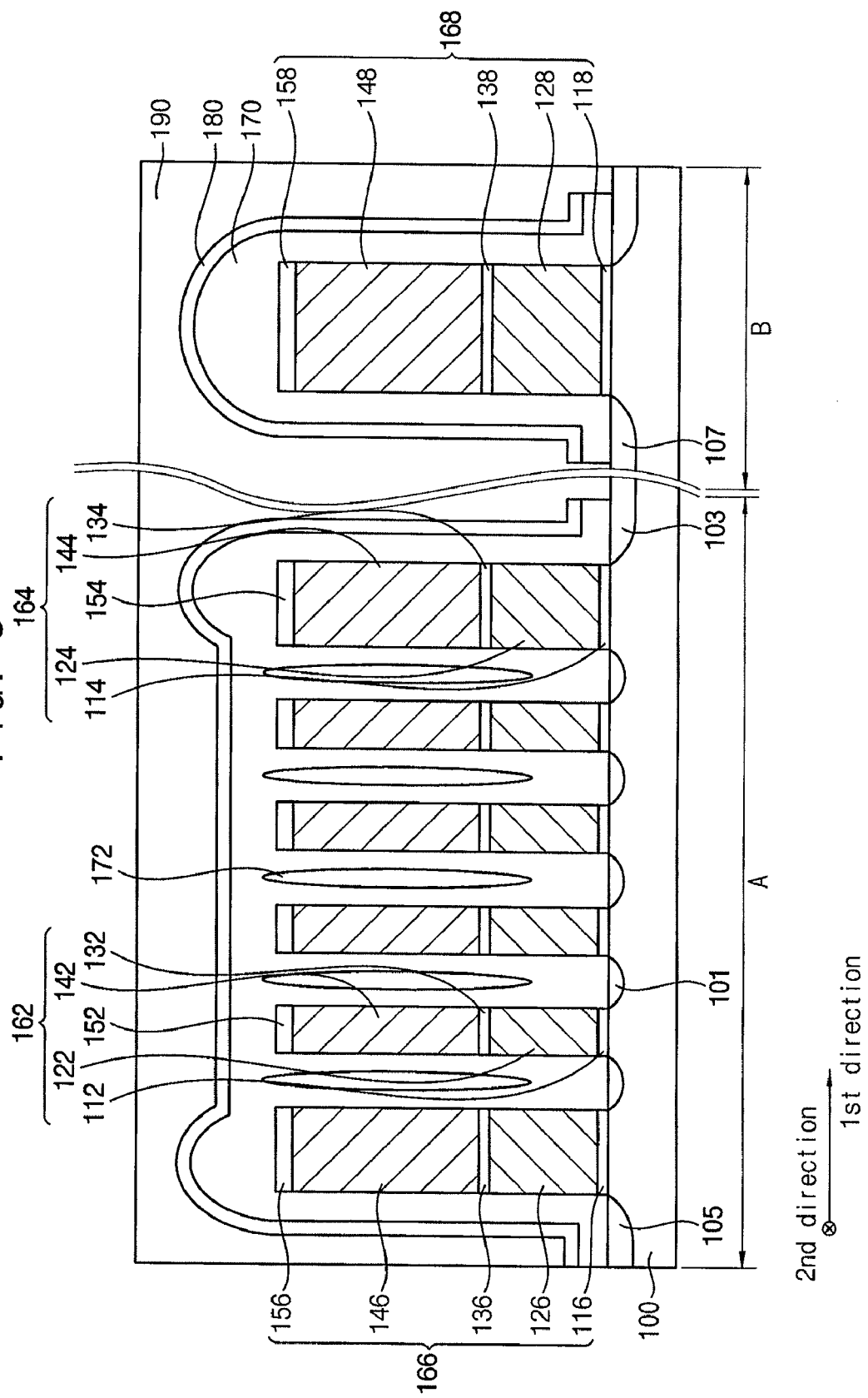

Referring to FIG. 5, a first insulation layer 190 may be formed on the etch stop layer 180 and the substrate 100 to cover the preliminary gate structures 162, 164, 166, and 168. For example, the first insulation layer 190 may be formed directly on the etch stop layer 180 and directly on portions of the substrate 100 that were exposed by the etching process that removed portions of the etch stop layer 180 and the capping layer 170.

The first insulation layer 190 may be formed by, e.g., a CVD process, an ALD process, a PVD process, etc. In example embodiments, the first insulation 190 may be formed using, e.g., at least one of an oxide such as a borophospho silicate glass (BPSG), an undoped silicate glass (USG), a spin on glass (SOG), etc.

Figure 6:
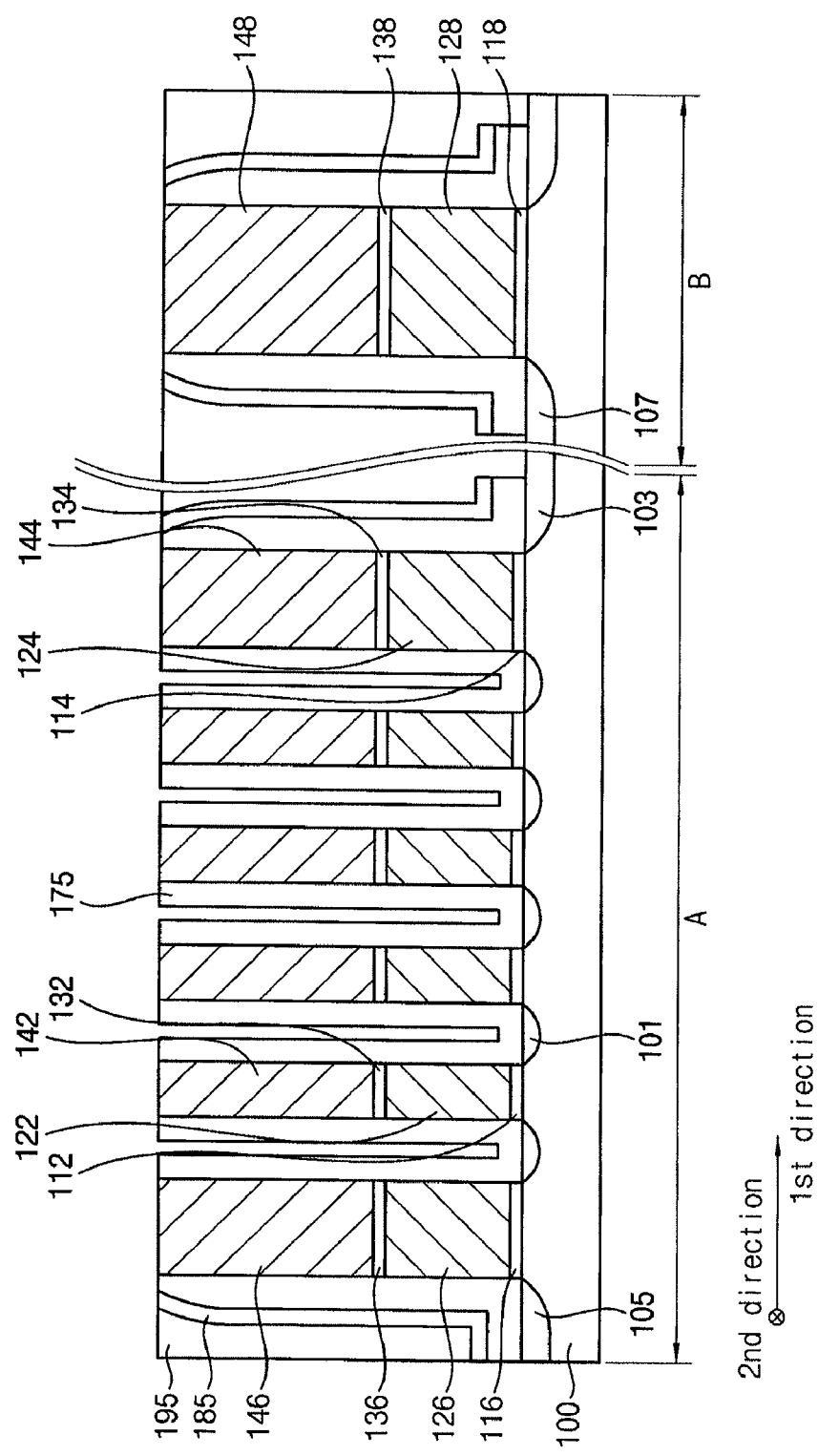

Referring to FIG. 6, upper portions of the first insulation layer 190, the etch stop layer 180, and the capping layer 170 may be planarized until top surfaces of the first through fourth preliminary gate structures 162, 164, 166, and 168 are exposed. For example, the planarization process may remove the first through fourth hard masks 152, 154, 156, and 158. Accordingly, top surfaces of the first through fourth preliminary control gates 142, 144, 146, and 148 may be exposed during the planarization process. The planarization process may be performed by, e.g., a chemical mechanical polishing (CMP) process.

After the planarization process, a capping layer pattern 175 may be formed on, e.g., directly on, sidewalls of the first to the third preliminary gate structures 162, 164 and 166. The capping layer pattern 175 may also be on a top surface of the substrate 100, e.g., portions of the substrate 100 having at least one of the fifth tunnel insulation layer pattern 111 and the first impurity region 101 thereunder in regions between the first to the third preliminary gate structures 162, 164, and 166. An etch stop layer pattern 185 and a first insulation layer pattern 195 may be sequentially formed on sidewalls of the second to fourth preliminary gate structures 164, 166, and 168. According to an exemplary embodiment, a plurality of capping layer patterns 175 may be formed in the first direction, e.g., the plurality of capping layer patterns 175 may be arranged along the first direction. Each capping layer pattern 175 may extend, e.g., may be elongated, in the second direction. The first direction may intersect the second direction.

For example, the etch stop layer pattern 185 and the first insulation layer pattern 195 may be formed on one sidewall of the second preliminary gate structure 164 and one sidewall of the third preliminary gate structure 166. Etched portions of the capping layer 170 may be disposed between the etch stop layer pattern 185 and those sidewalls of the second and third preliminary gate structures 164 and 166. Opposing sides of those sidewalls of the second and the third preliminary gate structures 164 and 166 may have the capping layer pattern 175 formed thereon without having the etch stop layer pattern 185 and the first insulation layer pattern 195 formed thereon. The etch stop layer pattern 185 and the first insulation layer pattern 195 may be formed on opposing sidewalls of the fourth preliminary gate structure 168. Etched portions of the capping layer 170 may be disposed between the etch stop layer pattern 185 and the opposing sidewalls of the fourth preliminary gate structure 168.

After the planarization process, a cleaning process may be further performed. In an exemplary embodiment, the cleaning process may be performed using, e.g., a sulfuric acid solution and/or a Standard Clean 1 (SC-1) solution.

After the planarization process and the cleaning process, the first seam 172 between the first to third preliminary gate structures 162, 164, and 166 may be exposed, and portions of the capping layer pattern 175 adjacent to the first seam 172 may be removed. Thus, the capping layer pattern 175 may be formed on sidewalls of the first to third preliminary gate structures 162, 164, and 166 and on top surfaces of the substrate 100 between the first to third preliminary gate structures 162, 164, and 166. The capping layer pattern 175 may be excluded, e.g., removed from, the top surfaces of the first through fourth preliminary control gates 142, 144, 146, and 148.

Figure 7:
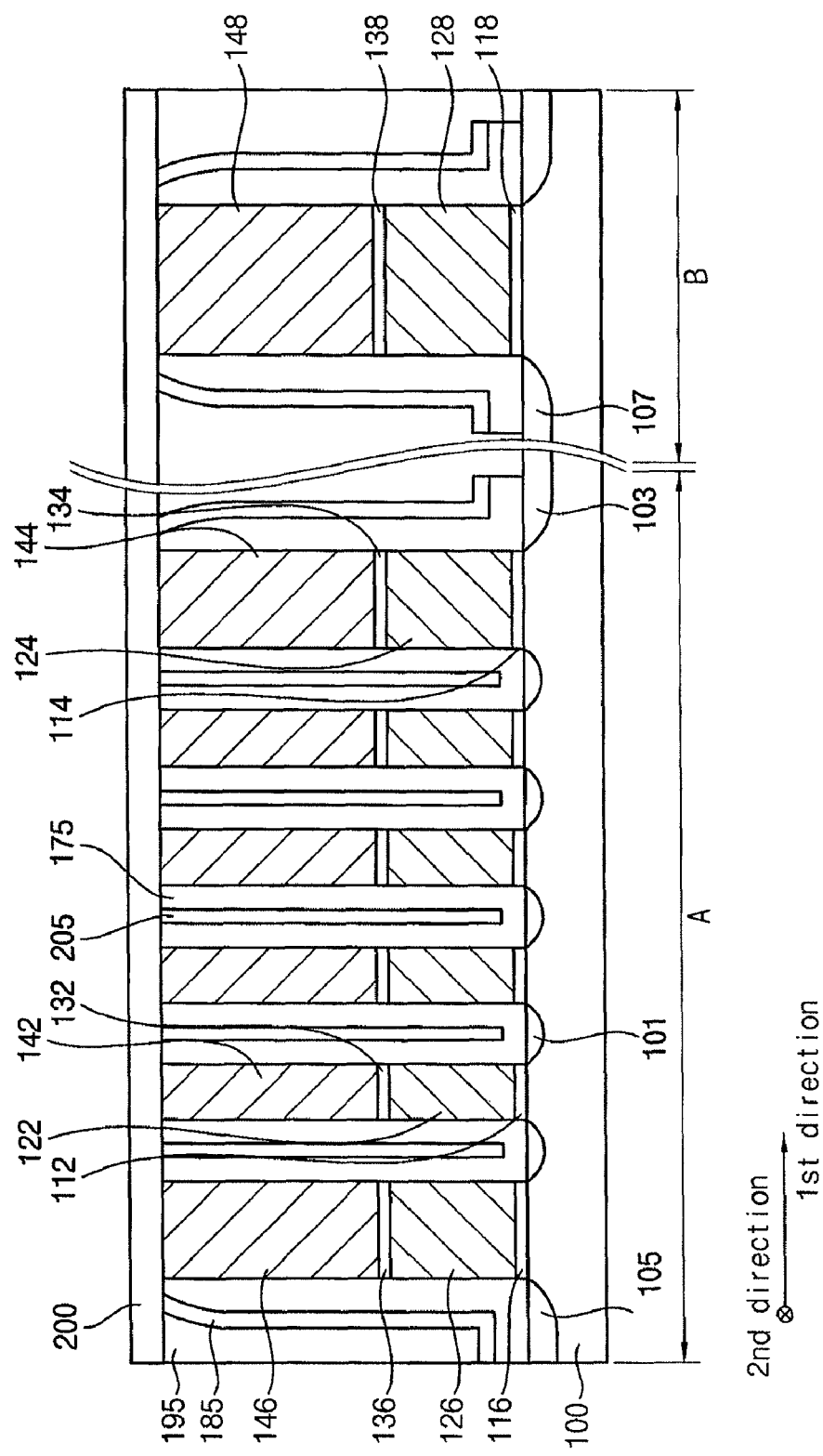

Referring to FIG. 7, a blocking layer 200 may be formed on, e.g., directly on, top surfaces of the preliminary gate structures 162, 164, 166, and 168, the capping layer pattern 175, the etch stop layer pattern 185, and the first insulation layer pattern 195.

The blocking layer 200 may reduce the possibility of and/or prevent upper portions of the preliminary control gates 142, 144, 146, and 148 from being etched in a subsequent process, e.g., when an upper portion of the capping layer pattern 175 is removed. The upper portion of the capping layer pattern 175 may be removed by, e.g., a dry etching process that is subsequently performed. The dry etching process may use, e.g., a gas including fluorine. The blocking layer 200 may serve as, e.g., an etch stop layer.

According to exemplary embodiments, the blocking layer 200 may be formed by a CVD process, a plasma enhanced chemical vapor deposition (PECVD) process, a high density plasma chemical vapor deposition (HDP-CVD) process or an ALD process. The blocking layer 200 may be formed using, e.g., at least one of silicon oxide such as a BPSG, a phospho silicate glass (PSG), an undoped silicate glass (USG), a spin on glass (SOG), a flowable oxide (FOX), tetraethyl orthosilicate (TEOS), a plasma enhanced tetraethyl orthosilicate (PE-TEOS), and a HDP-CVD oxide to have a thickness of about 100 Å to about 500 Å.

In an exemplary embodiment, the blocking layer 200 may be formed using, e.g., TEOS and ozone plasma by a PECVD process. The blocking layer 200 may not completely fill spaces defined by the capping layer patterns 175, e.g., after forming the blocking layer 200 voids may remain between portions of the capping layer patterns 175 on the sidewalls of the first through third preliminary gate structures 162, 164, and 166 and on the top surface of the substrate 100. The blocking layer 200 may be connected, e.g., directly connected, to the exposed top surfaces of the preliminary control gates 142, 144, 146, and 148. Thus, a space 205 may be formed beneath the blocking layer 200. The space 205 may be defined by the capping layer patterns 175 and the blocking layer 200. In an exemplary embodiment, a plurality of the spaces 205 may be arranged along the first direction and each of the spaces 205 may be formed to extend in the second direction. The first direction may intersect the second direction.

Figure 8:
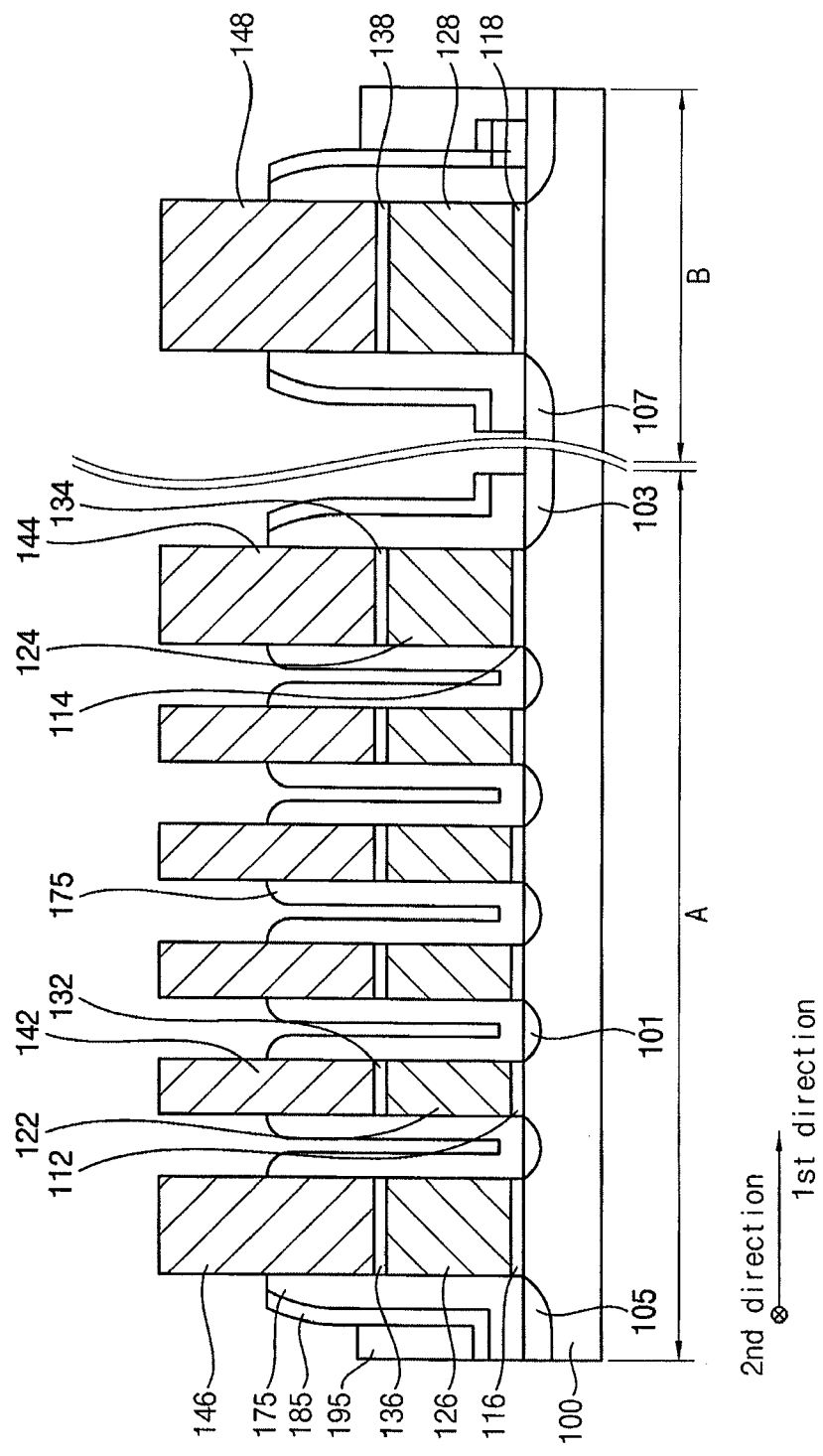

Referring to FIG. 8, the blocking layer 200 may be removed by a dry etching process using, e.g., a gas including fluorine. Upper portions of the capping layer pattern 175, upper portions of the etch stop layer pattern 185, and upper portions of the first insulation layer pattern 195 may also be removed, e.g., during the process of removing the blocking layer 200. Accordingly, upper portions of the preliminary control gates 142, 144, 146, and 148 may be exposed. Removing the blocking layer 200 may expose portions of the spaces 205. For example, the etched capping layer pattern 175, as partially removed, may cover sidewalls of the tunnel insulation layer patterns 112, 114, 116, and 118, sidewalls of the floating gates 122, 124, 126, and 128, sidewalls of the dielectric layer patterns 132, 134, 136, and 138, sidewalls of lower portions of the preliminary control gates 142, 144, 146, and 148, and top surfaces of the substrate 100 between the preliminary gate structures 162, 164, 166 and 168. Accordingly, a top surface of the capping layer pattern 175, as etched, may have a top surface higher than the dielectric layer patterns 132, 134, 136, and 138 of the preliminary gate structures 162, 164, 166, and 168. Only a partial portion, e.g., lower portions, of sidewalls of the preliminary control gates 142, 144, 146 and 148 may be covered by the capping layer pattern 175, as etched, so that upper portions of the preliminary control gates 142, 144, 146, and 148 are exposed.

Figure 9:
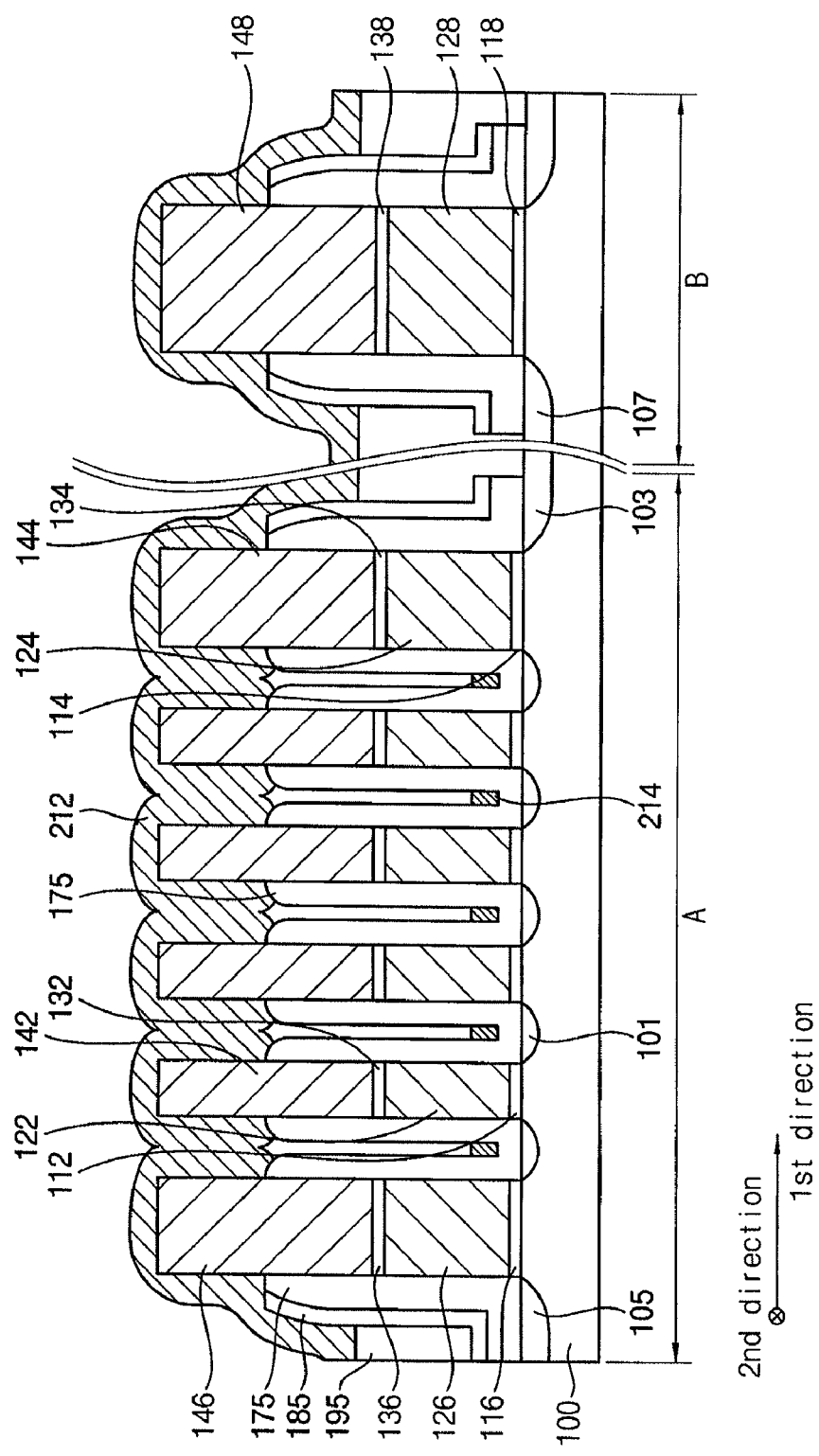

The etched capping layer pattern 175 may restrict a region, e.g., where a first conductive layer 212 may be formed, e.g., as illustrated in FIG. 9. The etched capping layer pattern 175 may restrict a region, e.g., in which the first conductive layer 212 may be reacted with the preliminary gate structures 162, 164, 166, and 168. For example, the etched capping layer pattern 175 may serve as a reaction prevention layer, e.g., with respect to the lower portions of sidewalls of the preliminary control gates 142, 144, 146, and 148 that are covered by the capping layer pattern 175, as etched.

In example embodiments, the dry etching process may be performed using, e.g., a mixture gas including at least nitrogen trifluoride ($NF_3$) and ammonia ($NH_3$). According to an exemplary embodiment, in the dry etching process, silicon oxide or silicon nitride of the blocking layer 200, the capping layer pattern 175, the etch stop layer pattern 185, and the first insulation layer pattern 195 may be reacted with nitrogen trifluoride ($NF_3$) and ammonia ($NH_3$) to be converted into a gas-phase compound that may be removed. Polysilicon of the preliminary control gates 142, 144, 146, and 148 may be minimally and/or rarely reacted with the mixture gas. That is, due to the dry etching process, the blocking layer 200, the upper portions of the capping layer pattern 175, the etch stop layer pattern 185 and the first insulation layer pattern 195 may be converted into a gas-phase compound, and the top surfaces and sidewalls of the upper portions of the preliminary control gates 142, 144, 146, and 148 may be exposed.

In example embodiments, the dry etching process may proceed from a surface of a layer contacting the mixture gas. That is, the blocking layer 200, the capping layer pattern 175, the etch stop layer pattern 185 and the first insulation layer pattern 195 may be gradually removed from upper portions thereof by the contact with the mixture gas. By controlling, e.g., the time for providing the mixture gas and/or other factors like amount of mixture gas, a portion of the capping layer pattern 175 that is removed by, e.g., the dry etching process, may be controlled. The capping layer pattern 175, as etched, may have a desired height, e.g., a predetermined height, based on the control of the mixture gas.

According to an exemplary embodiment, an upper portion of the capping layer pattern 175 may be removed faster than a lower portion thereof. Accordingly, the capping layer pattern 175 may have a thickness that may become thicker from a top portion to a bottom portion thereof. For example, the thickness of an upper portion of the capping layer pattern 175, after being etched by, e.g., the drying etching process, may increase, e.g., gradually increase, from an uppermost surface of the capping layer pattern 175 so that a tapered edge forms the uppermost surface of the capping layer pattern 175. A lower portion of the capping layer pattern 175, which is between the substrate 100 and the upper portion of the capping layer pattern 175, may have a substantially constant thickness.

A cleaning process may be performed to, e.g., remove a gas-phase compound and an unreacted compound remaining on the top surfaces and the sidewalls of the upper portions of the preliminary control gates 142, 144, 146, and 148. According to an exemplary embodiment, the cleaning process may be performed using SC-1 solution.

Referring to FIG. 9, a first conductive layer 212 may be formed on the preliminary control gates 142, 144, 146, and 148. The first conductive layer 212 may overhang the spaces 205 exposed by removing the blocking layer 200.

According to an exemplary embodiment, the first conductive layer 212 may be formed using, e.g., a metal such as cobalt, nickel, etc. The first conductive layer 212 may be formed by a deposition process, e.g., a physical vapor deposition (PVD) process. The first conductive layer 212 may be formed on the exposed portions of the preliminary control gates 142, 144, 146, and 148. A second conductive layer 214 may be formed on a portion of the capping layer pattern 175 and on the substrate 100, e.g., directly on a sidewall of the etch stop layer pattern 185 and directly on an upper surface of the first insulation layer pattern 195.

Figure 10:
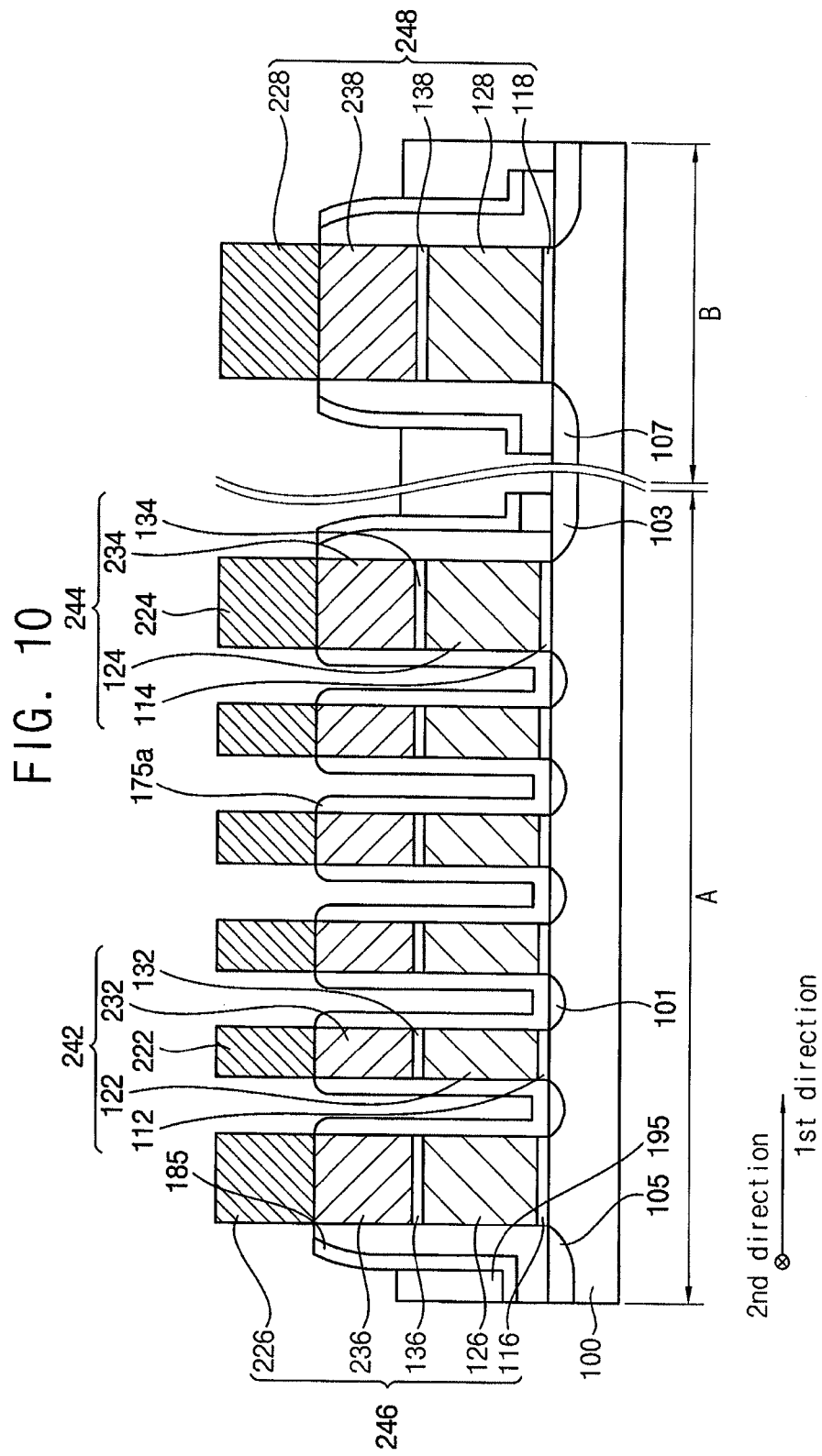

Referring to FIG. 10, the exposed portions of the preliminary control gates 142, 144, 146, and 148 may be reacted with the first conductive layer 212 to form first, second, third and fourth upper conductive patterns 222, 224, 226, and 228, respectively. Portions of the preliminary control gates 142, 144, 146, and 148 that are not reacted with the first conductive layer 212 may be defined as first, second, third and fourth lower conductive patterns 232, 234, 236, and 238, respectively. The first through fourth upper conductive patterns 222, 224, 226, and 228 together with the first through fourth lower conductive patterns 232, 234, 236, and 238 may define first through fourth control gates, respectively.

In example embodiments, portions of the preliminary control gates 142, 144, 146, and 148 including doped polysilicon may be reacted with the first conductive layer 212 to form a metal silicide layer. The silicidation process may be performed by, e.g., a heat treatment. According to an exemplary embodiment, when the first conductive layer 212 includes cobalt, a cobalt silicide layer may be foamed to have a bottom surface substantially coplanar with a top surface of the capping layer pattern 175. For example, the portions of the preliminary control gates 142, 144, 146, and 148 not covered by the capping layer pattern 175 may be reacted with the first conductive layer 212 to form upper conductive patterns 222, 224, 226, and 228, respectively.

According to an exemplary embodiment, metal of the first conductive layer 212 may be reacted with silicon of the preliminary control gates 142, 144, 146, and 148 to form a metal silicide layer. However, embodiments are not limited thereto, e.g., other types of reaction may also occur. If the characteristics, e.g., low resistance characteristics, of the preliminary control gates 142, 144, 146, and 148 may be improved by reaction with the first conductive layer 212 on the exposed portions of the preliminary control gates 142, 144, 146, and 148, any types of reaction may be within the scope of the embodiments. Further, a conductive layer and/or an insulating layer may be formed on the preliminary control gates 142, 144, 146, and 148, e.g., if the insulating layer may be reacted with the preliminary control gates 142, 144, 146, and 148. In this respect, the first conductive layer 212 and the capping layer pattern 175 may serve as a reaction layer and a reaction prevention layer, respectively.

Portions of the first conductive layer 212 that are not reacted with the preliminary control gates 142, 144, 146, and 148 and the second conductive layer 214 may be removed, e.g., by a stripping process. The stripping process may be performed using, e.g., sulfuric acid and/or peroxide. The stripping process may be performed using the characteristics that metal may be melted in strong acid, but metal silicide such as cobalt silicide may not be melted therein. Thus, first, second, third and fourth gate structures 242, 244, 246, and 248 may be formed on the substrate 100.

The first through fourth gate structures 242, 244, 246, and 248 may include the first through fourth tunnel insulation layer patterns 112, 114, 116, and 118, the first through fourth floating gates 122, 124, 126, and 128, the first through fourth dielectric layer patterns 132, 134, 136, and 138, the first through fourth lower conductive patterns 232, 234, 236, and 238, and the first through fourth upper conductive patterns 222, 224, 226, and 228, respectively.

The first, second, and third control gates included in the first, second, and third gate structures 242, 244, and 246, respectively, may be formed in the first region A. The first control gate may serve as a word line. The second control gate may serve as a ground selection line (GSL). The third control gate may serve as a string selection line (SSL). However, embodiments are not limited thereto.

According to an exemplary embodiment, a cleaning process may be performed to, e.g., partially remove a surface of the capping layer pattern 175. For example, performing the cleaning process may reduce a thickness, e.g., a width along the first direction, of the capping layer pattern 175. A first capping thin film pattern 175*a* may remain on sidewalls of the gate structures 242, 244, 246, and 248 and on the substrate 100. An air gap 260*a* (refer to FIG. 12A) may be formed. The air gap 260*a* may have a wider width at portions thereof and may be formed between the first to third gate structures 242, 244, and 246. In an exemplary embodiment, the cleaning process may be performed using SC-1 solution.

A surface of the first capping thin film pattern 175*a* may be further removed by processes illustrated with reference to FIGS. 11 and 12A.

Figure 11:
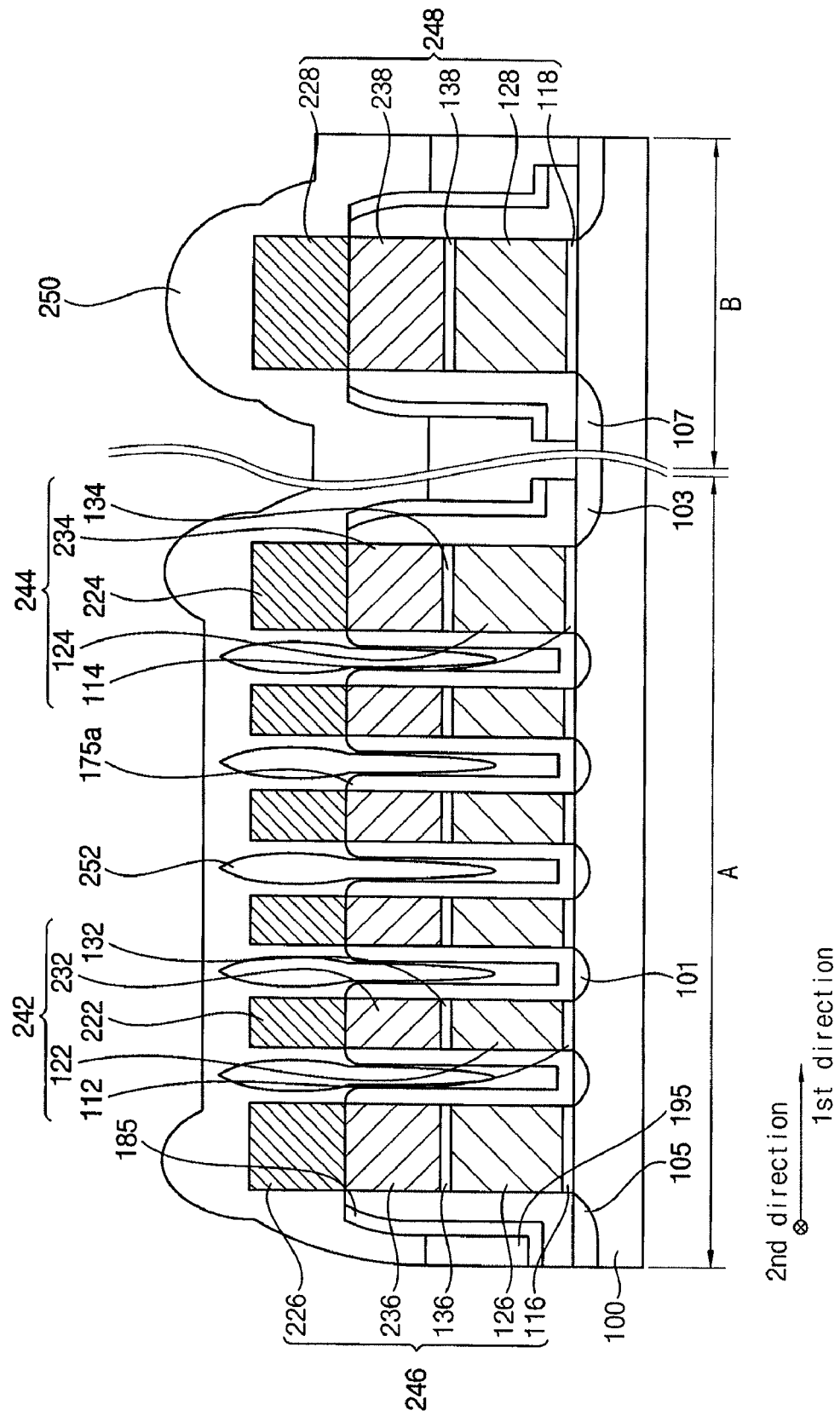

Referring to FIG. 11, a sacrificial layer 250 may be formed on the substrate 100 to cover the gate structures 242, 244, 246, and 248, the first capping thin film pattern 175*a*, the etch stop layer pattern 185, and the first insulation layer pattern 195. The sacrificial layer 250 may be formed using, e.g., at least one of silicon oxide, silicon nitride, and polysilicon. The sacrificial layer 250 may have a high etching selectivity with respect to metal silicide, by a CVD process, a PECVD process, and/or a low pressure chemical vapor deposition (LPCVD) process, etc. The sacrificial layer 250 may not completely fill spaces between the gate structures 242, 244, 246, and 248. Thus, second seams 252, e.g., voids in the sacrificial layer 250, may be formed between the first to third gate structures 242, 244, and 246.

The sacrificial layer 250 may be removed by, e.g., a dry etching process or a wet etching process. During the etching process, a surface of the first capping thin film pattern 175*a* may be removed to form a second capping thin film pattern 175*b*. For example, the etching process may reduce a thickness, e.g., a width along the first direction, of the first capping layer pattern 175*a*.

According to exemplary embodiments, when the sacrificial layer 250 includes a plasma enhanced oxide (PEOX) and/or a MTO, the sacrificial layer 250 and the surface of the first capping thin film pattern 175*a* may be removed by a dry etching process using, e.g., plasma. When the sacrificial layer 250 includes silicon nitride, the sacrificial layer 250 and the surface of the first capping thin film pattern 175*a* may be removed by a wet etching process using, e.g., a phosphoric acid solution having a good etching selectivity with respect to metal silicide. When the sacrificial layer 250 includes polysilicon, the sacrificial layer 250 and the surface of the first capping thin film pattern 175*a* may be removed by a wet etching process using, e.g., an ammonia water having a good etching selectivity with respect to metal silicide.

Figure 12A:
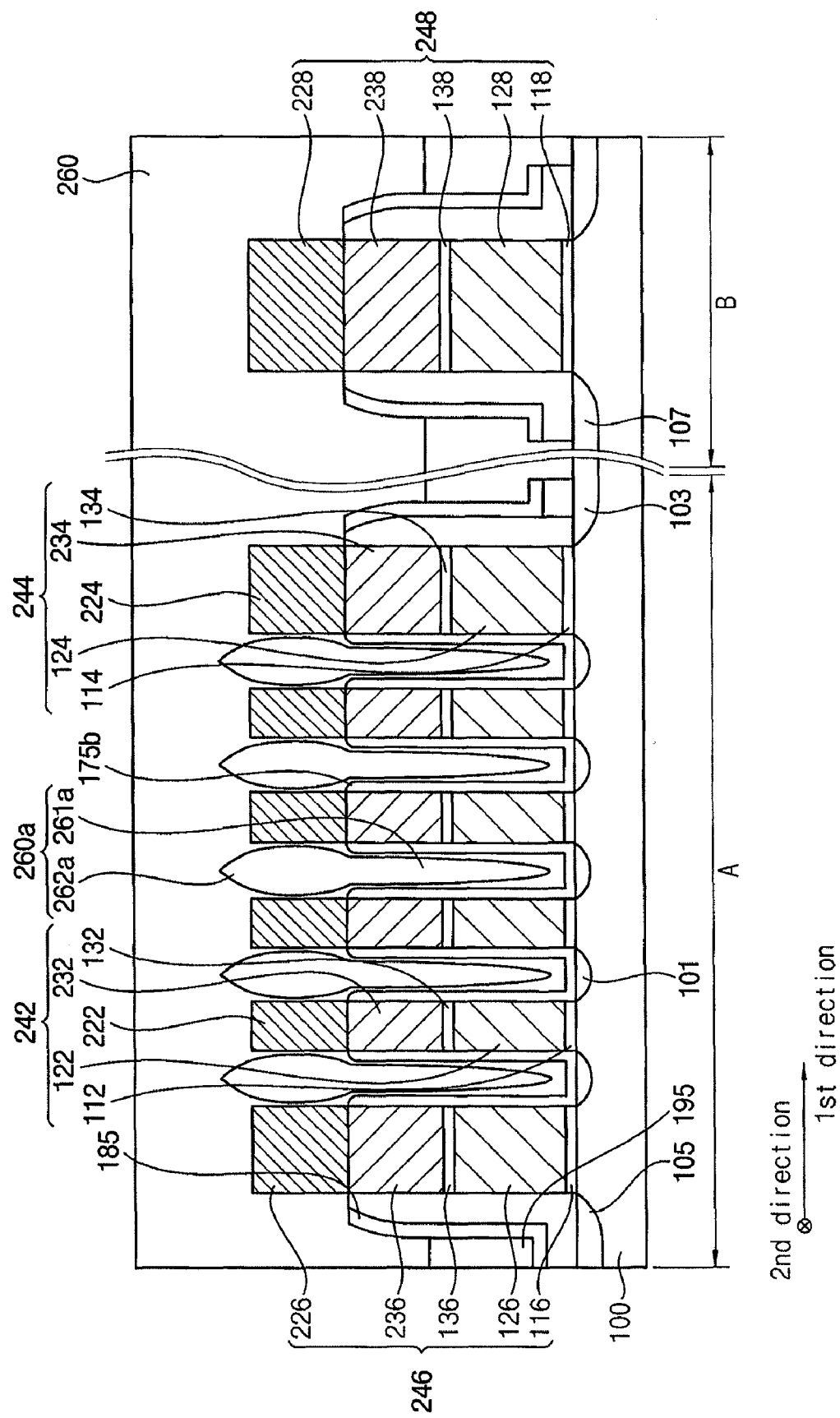

Referring to FIG. 12A, a second insulation layer 260 may be formed on the substrate 100 to cover the gate structures 242, 244, 246, and 248, the second capping thin film pattern 175*b*, and the etch stop layer pattern 185. The second insulation layer 260 may not completely fill spaces between the gate structures 242, 244, 246, and 248. Thus, first air gaps 260*a* may be formed between the first, second, and third gate structures 242, 244, and 246. In example embodiments, the first air gap 260*a* may be formed to extend in the second direction. The air gap 260*a* may be referred to as a first air tunnel.

The second insulation layer 260 may be formed using, e.g., an oxide such as BPSG, USG, SOG, etc. by a CVD process, a PECVD process, an LPCVD process, etc. The second insulation layer 260 may be formed using, e.g., a material having poor step coverage so that the first air gap 260*a* may be formed therein based on the poor step coverage.

The first air gap 260*a* may be formed to have a top surface that is higher than top surfaces of the first, second, and third gate structures 242, 244, and 246. The first air gap 260*a* may be formed to include a lower portion 261*a* having a first width and an upper portion 262*a* having a second width. The second width of the upper portion 262*a* may be larger than the first width of the lower portion 261*a*. A widest portion of the upper portion 262*a* may have a greater width than a widest portion of the lower portion 261*a*. The first width of the lower portion 261*a* may gradually vary, e.g., the width may increase as a distance from the substrate 100 increases. The second width of the upper portion 262*a* may gradually vary, e.g., the second width may first increase as a distance away from the substrate 100 increases to a midpoint and after the midpoint the second width may gradually decrease as a distance away from the substrate 100 increase to form an uppermost surface that is a sharp edge. In an exemplary embodiment, the lower portion 261*a* of the first air gap 260*a* may have a linear shape or a bar shape extending in a direction perpendicular to a top surface of the substrate 100. For example, the upper portion 262*a* of the first air gap 260*a* may have an oval shape of which a top surface is sharp. The portions of upper portion 262*a* having greater width than, e.g., the lower portion 261*a*, may be between the upper conductive patterns 222, 224, and 226.

When the second insulation layer 260 is formed, the lower portion 261*a* having, e.g., a linear shape or a bar shape having a relatively narrow width, may be formed in an area narrowed by the second capping thin film pattern 175*b* on the sidewall of the first through third gates 242, 244, and 246. The upper portion 262*a* having, e.g., an oval shape having a relatively wide width, may be formed in an area in which the second capping thin film pattern 175*b* is not formed. In this case, as the second capping thin film pattern 175*b* has a thicker thickness, the width difference between the upper portion 262*a* and the lower portion 261*a* may be larger.

The first air gap 260*a* may be defined only by the second insulation layer 260. That is, the second insulation layer 260 may be formed to cover not only the gate structures 242, 244, 246, and 248 but also the second capping thin film pattern 175*b*, so that the boundary of the first air gap 260*a* may be defined only by the second insulation layer 260. The first air gap 260*a* may be near and/or adjacent to the upper conductive patterns 222, 224, and 226 and the second capping thin film pattern 175*b*.

Referring to FIG. 12B, second air gaps 260*b* defined by the second insulation layer 260 and the second capping thin film pattern 175*b* may be formed, according to another exemplary embodiment. The second insulation layer 260 may be formed to cover the gate structures 242, 244, 246, and 248 and a portion of the second capping thin film pattern 175*b*, so that the boundary of the second air gap 260*b* may be defined by both of the second insulation layer 260 and the second capping thin film pattern 175*b*. The second air gap 260*b* may be formed to extend in the second direction. The second air gap may be also referred to as a second air tunnel. The second air gap 260*b* may also include a lower portion 261*b* and an upper portion 262*b*. The upper portions 262*b* may be near to, adjacent to, and/or abut the upper conductive patterns 222, 224, and 226. The lower portions 261*b* may be near to, adjacent to, and/or abut the second capping thin film pattern 175*b*.

Hereinafter, the semiconductor device including the second insulation layer 260 having only the first air gap 260*a* therein is illustrated. However, embodiments are not limited thereto, e.g., the semiconductor device may include the second air gaps 260*c*.

Figure 13:
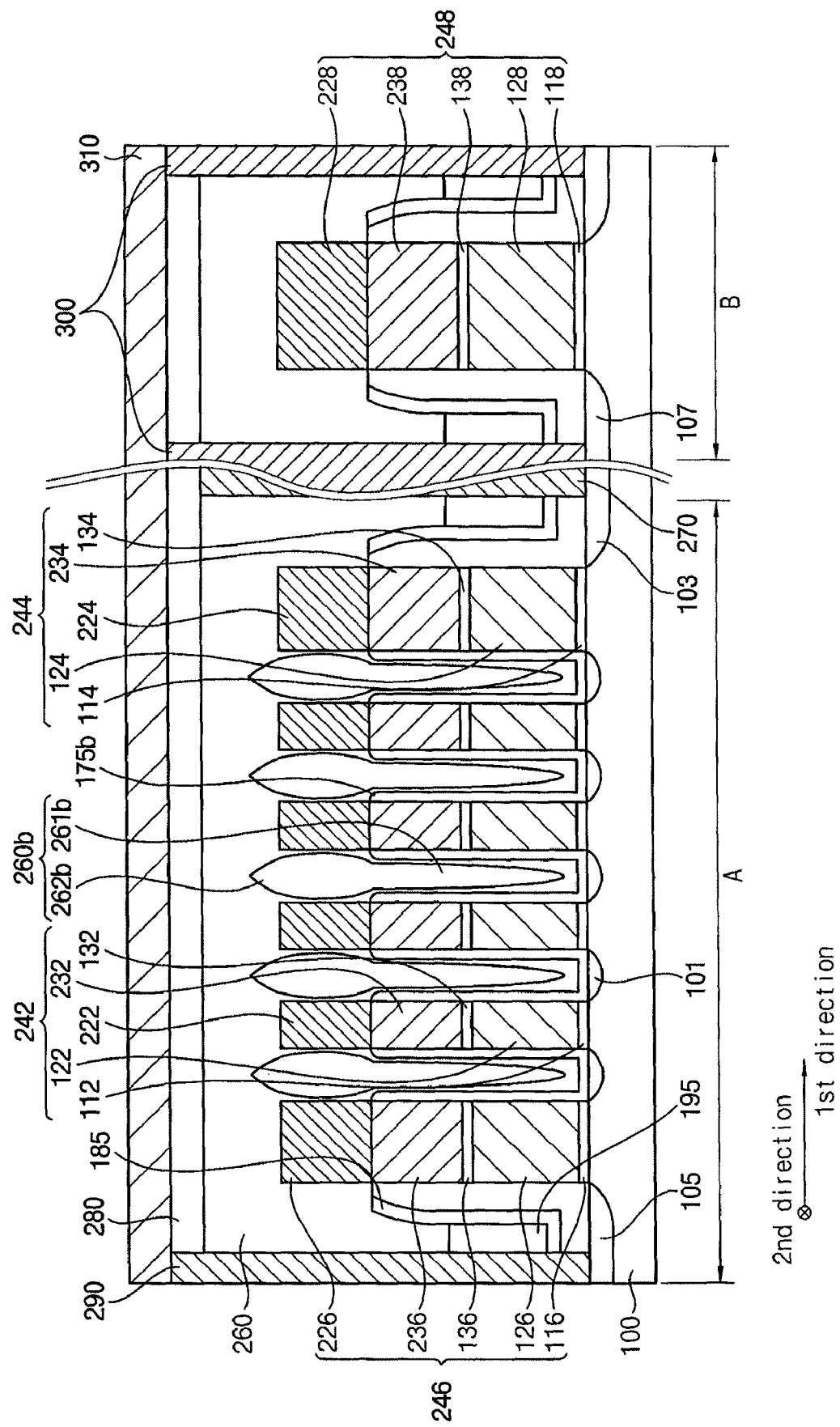

Referring to FIG. 13, a common source line (CSL) 270 may be formed on the second impurity region 103. The CSL 270 may extend through the second insulation layer 260, the first insulation layer pattern 195, the etch stop layer pattern 185, and the capping layer pattern 175 to be on, e.g., directly on, the second impurity region 103. The CSL 270 may be formed using, e.g., doped polysilicon, a metal, and/or a metal silicide. The CSL 270 may be arranged in first region A.

A third insulation layer 280 may be formed on the second insulation layer 260 and the CSL 270. The third insulation layer 280 may be formed using, e.g., an oxide such as BPSG, USG, SOG, etc.

A bit line contact 290 may be formed on, e.g., directly on, the third impurity region 105 in first region A. The bit line contact 290 may extend through the second and the third insulation layers 260 and 280. The bit line contact 290 may be formed using, e.g., a metal, doped polysilicon, etc. A plug 300 may be formed on, e.g., directly on, the fourth impurity region 107 in the second region B. The plug 300 may extend through at least the second and third insulation layers 260 and 280.

A bit line 310 may be formed on the third insulation layer 280 to, e.g., be electrically connected to the bit line contact 290. The bit line 310 may be formed to extend in the first direction. The bit line 310 may be formed using, e.g., a metal, doped polysilicon, etc. The bit line 310 may be also formed in the second region B to, e.g., be electrically connected to the plug 300. By the above exemplary processes, the semiconductor device in accordance with example embodiments may be manufactured.

By way of summation and review, as semiconductor devices have been highly integrated, a threshold voltage may be changed due to the parasitic capacitance between word lines. Thus, a method of manufacturing a semiconductor device in which, e.g., the parasitic capacitance may be reduced is needed. A method of forming an air gap between word lines has been developed. Further, when word lines of gate structures are formed to include, e.g., metal silicide, a reaction prevention layer may be formed on sidewalls of gate structures so that the silicidation of the word lines may be controlled. However, forming air gaps having a uniform size may not be easy due to the reaction prevention layer.

In contrast, according to embodiments, e.g., the exemplary embodiments discussed above, a capping layer may be formed to cover a plurality of preliminary gate structures and the capping layer may have a seam between the preliminary gate structures on a substrate. The capping layer may be planarized until, e.g., top surfaces of the preliminary gate structures are exposed to form a capping layer pattern. A blocking layer may be formed on the exposed top surfaces of the preliminary gate structures and on a top surface of the capping layer pattern. Thereafter, the blocking layer and a portion of the capping layer pattern may be removed, e.g., to expose upper portions of the preliminary gate structures. A silicidation process may be performed on the upper portions of the preliminary gate structures to form gate structures including, e.g., control gates having a low resistance. A deposition process having, e.g., a poor step coverage, may be performed to form an insulation layer having an air gap between the gate structures. The parasitic capacitance of the resultant semiconductor device may be decreased, according to an exemplary embodiment. The air gap may be formed to have, e.g., a top surface higher than top surfaces of the gate structures. The air gaps may be uniformly formed. Accordingly, embodiments relate to methods of manufacturing semiconductor devices having air gaps. Example embodiments provide a method of manufacturing a semiconductor device including air gaps having a uniform size.

The foregoing is illustrative of example embodiments and is not to be construed as limiting thereof. although specific terms are employed, Although a few example embodiments have been described, they are used and are to be interpreted in a generic and descriptive sense only and not for purpose of limitation, and those skilled in the art will readily appreciate that many modifications are possible in the exemplary embodiments without departing from the spirit and scope of the present invention as set forth in the following claims. Accordingly, all such modifications are intended to be included within the scope of the present inventive concept as defined in the claims. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated.

Accordingly, it is to be understood that the foregoing is illustrative of various example embodiments and is not to be construed as limited to the specific exemplary embodiments disclosed, and that modifications to the disclosed exemplary embodiments, as well as other example embodiments, are intended to be included within the scope of the appended claims.

What is claimed is:

1. A method of manufacturing a semiconductor device, the method comprising:
    forming a plurality of preliminary gate structures on a substrate;
    forming a capping layer pattern on sidewalls of the plurality of preliminary gate structures and on a top surface of the substrate between the preliminary gate structures;
    forming a blocking layer on top surfaces of the plurality of preliminary gate structures and the capping layer pattern such that a void is formed between the blocking layer and the capping layer pattern;
    removing the blocking layer and an upper portion of the capping layer pattern such that at least the upper sidewalls of the plurality of preliminary gate structures are exposed, a lower portion of the capping layer pattern remaining on lower sidewalls of the preliminary gate structures;
    forming a conductive layer on at least the upper sidewalls of the plurality of preliminary gate structures;
    reacting the conductive layer with the preliminary gate structures to form a plurality of gate structures; and
    forming a second insulation layer on the substrate to cover the gate structures, the second insulation layer having an air gap therein between the plurality of gate structures.

2. The method as claimed in claim 1, further comprising forming a first insulation layer, wherein:
    forming the capping layer pattern includes forming a capping layer on the substrate, the capping layer covering the preliminary gate structures, and the capping layer having a gap therein between the preliminary gate structures,
    forming the first insulation layer on the capping layer and the substrate, and
    planarizing upper portions of the first insulation layer and the capping layer until the top surfaces of the preliminary gate structures and the gap are exposed.

3. The method as claimed in claim 2, further comprising forming an etch stop layer on the capping layer and the substrate after forming the capping layer, wherein:
    the first insulation layer is formed on the etch stop layer, and planarizing the upper portions of the first insulation layer and the capping layer includes planarizing an upper portion of the etch stop layer.

4. The method as claimed in claim 1, wherein forming the capping layer pattern includes performing a dry etching process using a gas including fluorine.

5. The method as claimed in claim 4, wherein the gas including fluorine is a gas mixture including nitrogen trifluoride (NF$_3$) and ammonia (NH$_3$).

6. The method as claimed in claim 1, wherein the capping layer pattern is formed using at least one of silicon oxide, silicon nitride, and silicon oxynitride.

7. The method as claimed in claim 6, wherein the blocking layer is formed using at least one of a borophospho silicate glass (BPSG), a phospho silicate glass (PSG,) an undoped silicate glass (USG), a spin on glass (SOG), a flowable oxide (FOX), tetraethyl orthosilicate (TEOS), a plasma enhanced tetraethyl orthosilicate (PE-TEOS), and a high density plasma chemical vapor deposition (HDP-CVD) oxide.

8. The method as claimed in claim 1, wherein the blocking layer is formed by a plasma enhanced chemical vapor deposition (PECVD) process using tetraethyl orthosilicate (TEOS) and an ozone plasma.

9. The method as claimed in claim 1, wherein a thickness of the blocking layer is about 100 Å to about 500 Å.

10. The method as claimed in claim 1, wherein:
each preliminary gate structure of the plurality of preliminary gate structures includes a tunnel insulation layer pattern, a floating gate, a dielectric layer pattern, and a preliminary control gate sequentially stacked on the substrate, and
the capping layer pattern covers the top surface of the substrate between the preliminary gate structures an at least sidewalls of the tunnel insulation layer pattern, the floating gate, and the dielectric layer pattern.

11. The method as claimed in claim 10, wherein:
each of the preliminary gate structures includes doped polysilicon,
the conductive layer includes cobalt or nickel, and
reacting the conductive layer with the preliminary gate structures includes performing a silicidation process.

12. The method as claimed in claim 1, further comprising forming a first capping thin film pattern by a cleaning process on the capping layer pattern, a thickness of the first capping thin film pattern being smaller than a thickness of the capping layer pattern.

13. The method as claimed in claim 1, further comprising performing a stripping process to remove a portion of the conductive layer that is substantially unreacted with the preliminary gate structures.

14. The method as claimed in claim 13, further comprising, after performing the stripping process, removing a surface of the capping layer pattern to form a second capping thin film pattern.

15. The method as claimed in claim 14, further comprising forming a sacrificial layer covering the capping layer pattern and the plurality of gate structures, wherein forming the second capping thin film pattern includes partially removing the sacrificial layer and the capping layer pattern.

16. A method of manufacturing a semiconductor device, the method comprising:
forming a plurality of preliminary gate structures on a substrate;
forming a capping layer pattern on sidewalls of the plurality of preliminary gate structures;
forming a blocking layer on the capping layer pattern such that a void is formed between the blocking layer and the capping layer pattern;
exposing top surfaces and upper sidewalls of the plurality of preliminary gate structures by removing the blocking layer and an upper portion of the capping layer pattern, a lower portion of the capping layer pattern remaining on lower sidewalls of the preliminary gate structures;
forming a conductive layer on the top surfaces and the upper sidewalls of the plurality of preliminary gate structures;
reacting the conductive layer with the top surfaces and the upper sidewalls of the preliminary gate structures to form a plurality of gate structures; and
covering the plurality of gate structures with an insulation layer, the insulation layer having an air gap therein between the gate structures.

17. The method as claimed in claim 16, wherein reacting the conductive layer with the top surfaces and the upper sidewalls of the plurality of preliminary gate structures includes forming a metal silicide layer by performing a silicidation process, the metal silicide layer forming an upper portion of the plurality of gate structures.

18. The method as claimed in claim 17, wherein:
exposing the top surfaces and the upper sidewalls of the plurality of preliminary gate structures includes exposing the void formed between the blocking layer and the capping layer pattern prior to forming the conductive layer, and
forming the conductive layer such that the conductive layer overhangs the void.

19. The method as claimed in claim 17, wherein the lower portion of the capping layer pattern remains on the lower sidewalls of the preliminary gate structures during the reacting of the conductive layer with the top surfaces and the upper sidewalls of the preliminary gate structures.

20. The method as claimed in claim 17, wherein:
the air gap is formed after reacting the conductive layer with the top surfaces and the upper sidewalls of the preliminary gate structures,
a boundary of the air gap is defined by the insulation layer, and
when the air gap is formed, the lower portion of the capping layer pattern remains on the lower sidewalls of the preliminary gate structures such that the air gap is adjacent to the lower portion of the capping layer pattern and adjacent to the metal silicide layer.

* * * * *